United States Patent
Morita et al.

(10) Patent No.: US 12,553,164 B2
(45) Date of Patent: Feb. 17, 2026

(54) SHEET CONTAINING NANOFIBERS AND METHOD FOR PRODUCING SAME

(71) Applicant: Murata Manufacturing Co., Ltd., Nagaokakyo (JP)

(72) Inventors: Yusuke Morita, Kyotanabe (JP); Koki Yokota, Kyotanabe (JP); Kenichiro Takumi, Nagaokakyo (JP); Shuichi Nakanishi, Nagaokakyo (JP); Masayuki Tsuji, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 161 days.

(21) Appl. No.: 18/056,433

(22) Filed: Nov. 17, 2022

(65) Prior Publication Data

US 2023/0085519 A1   Mar. 16, 2023

Related U.S. Application Data

(63) Continuation of application No. PCT/JP2021/020900, filed on Jun. 1, 2021.

(30) Foreign Application Priority Data

Jun. 2, 2020 (JP) .................. 2020-096415

(51) Int. Cl.
*D04H 1/728* (2012.01)
*D01D 5/00* (2006.01)
(Continued)

(52) U.S. Cl.
CPC ........... *D04H 1/728* (2013.01); *D01D 5/0046* (2013.01); *D01D 5/084* (2013.01); *D04H 1/435* (2013.01);
(Continued)

(58) Field of Classification Search
None
See application file for complete search history.

(56) References Cited

U.S. PATENT DOCUMENTS

| | | |
|---|---|---|
| 5,298,602 A | 3/1994 | Shikinami et al. |
| 2008/0233162 A1 | 9/2008 | Lee et al. |

(Continued)

FOREIGN PATENT DOCUMENTS

| | | |
|---|---|---|
| CN | 104018294 A | 9/2014 |
| CN | 105002657 A | 10/2015 |

(Continued)

OTHER PUBLICATIONS https://patents.google.com/patent/EP1731633A1/en?oq=EP1731633 (Year: 2007).*

(Continued)

*Primary Examiner* — Arti Singh-Pandey
(74) *Attorney, Agent, or Firm* — ArentFox Schiff LLP

(57) ABSTRACT

A method for producing a sheet having nanofibers that contain a piezoelectric polymer material. The method including dissolving a piezoelectric polymer material into a solvent so as to prepare a spinning solution; preheating a target board before nanofibers are formed by electrospinning the spinning solution; and, after the heating of the target board, receiving the nanofibers formed by electrospinning onto the heated target board so as to form the nanofibers into a sheet on the heated target board.

8 Claims, 34 Drawing Sheets

(51) Int. Cl.
  D01D 5/084 (2006.01)
  D04H 1/435 (2012.01)
  D04H 1/4382 (2012.01)
  D04H 1/74 (2006.01)

(52) U.S. Cl.
  CPC .......... *D04H 1/43838* (2020.05); *D04H 1/74* (2013.01); *D10B 2331/041* (2013.01); *D10B 2401/16* (2013.01)

(56) References Cited

U.S. PATENT DOCUMENTS

| | | |
|---|---|---|
| 2009/0076530 A1 | 3/2009 | Fukutomi et al. |
| 2009/0189318 A1 | 7/2009 | Kim |
| 2012/0029654 A1 | 2/2012 | Xu et al. |
| 2015/0290354 A1 | 10/2015 | Loboa et al. |
| 2016/0083868 A1 | 3/2016 | Park |
| 2016/0121024 A1 | 5/2016 | Kasuga et al. |
| 2017/0029981 A1 | 2/2017 | Chen et al. |
| 2020/0378846 A1* | 12/2020 | Onishi ............... G01L 1/16 |
| 2023/0243076 A1* | 8/2023 | Ebina ............... D04B 1/16 66/169 R |

FOREIGN PATENT DOCUMENTS

| | | |
|---|---|---|
| CN | 106149203 A | 11/2016 |
| CN | 107007889 A | 8/2017 |
| JP | 3023471 B2 | 3/2000 |
| JP | 3023472 B2 | 3/2000 |
| JP | 2006283241 A | 10/2006 |
| JP | 2007517991 A | 7/2007 |
| JP | 20086276 A | 1/2008 |
| JP | 2008179916 A | 8/2008 |
| JP | 2009507530 A | 2/2009 |
| JP | 2012519559 A | 8/2012 |
| JP | 2014147342 A | 8/2014 |
| JP | 201545114 A | 3/2015 |
| JP | 2015117309 A | 6/2015 |
| JP | 2016214210 A | 12/2016 |
| JP | 2017171614 A | 9/2017 |
| JP | 2019115322 A | 7/2019 |
| JP | 2019115323 A | 7/2019 |
| JP | 202033659 A | 3/2020 |
| WO | 2007102606 A1 | 9/2007 |
| WO | 2011093147 A1 | 8/2011 |
| WO | 2015005205 A1 | 1/2015 |
| WO | WO-2019031414 A1 * | 2/2019 ............... G01L 1/16 |

OTHER PUBLICATIONS

Enomae et al., "Nondestructive determination of fiber orientation distribution of fiber surface by image analysis," Nordic Pulp and Paper Research Journal, 2006, vol. 21, No. 2, 19 pages.

International Search Report in PCT/JP2021/020900, mailed Aug. 31, 2021, 4 pages.

Lee et al., "Structure development and biodegradabililty of uniaxially stretched poly(L-lactide)," European Polymer Journal, 2001, vol. 37, pp. 907-914.

Morita, Yusuke, "Development of PLLA Nanofiber Scaffold Doped with BaTiO3 by Electrospinning for Bone/Cartilage Tissue Engineering," Report of Research Achievements in Grants-in-Aid for Scientific Research, Jun. 6, 2015. Retrieved from Internet <URL:https://kaken.nii.ac.jp/ja/file/KAKENHI-PROJECT-24560114/24560114seika.pdf>, 4 pages.

* cited by examiner

Fig. 6A 4w/w%, 25 °C
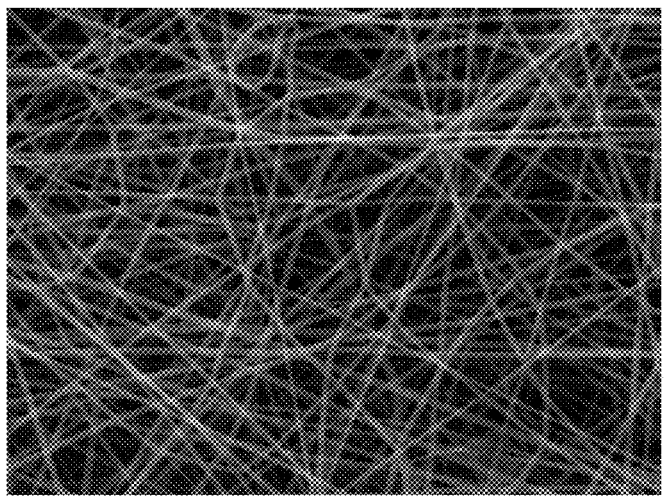
Fig. 6B 4w/w%, 40 °C
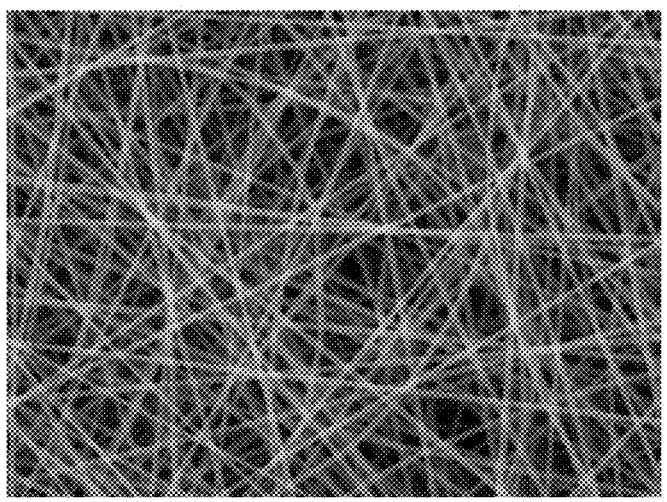
Fig. 6C 4w/w%, 60 °C
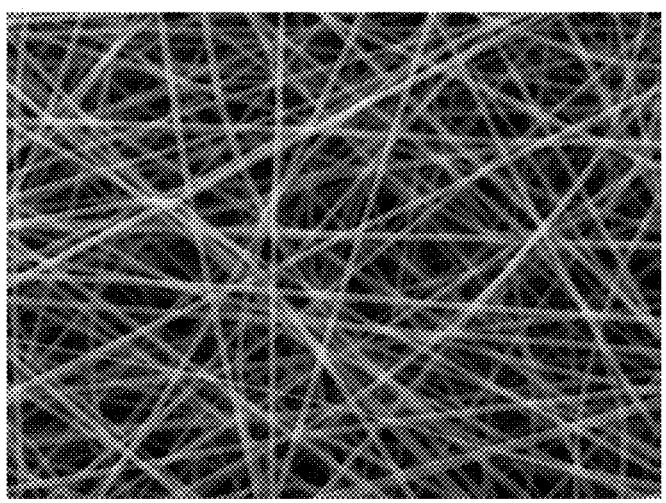

Fig. 6D 4w/w%, 80 °C
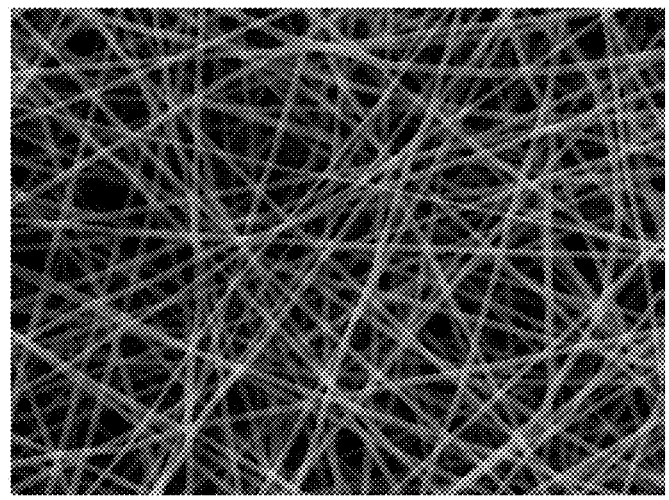
Fig. 6E 4w/w%, 100 °C
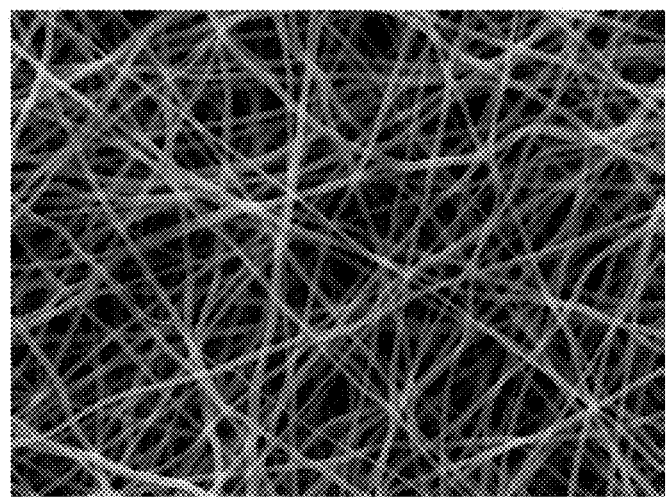

Fig.7A 5w/w%, 25 °C
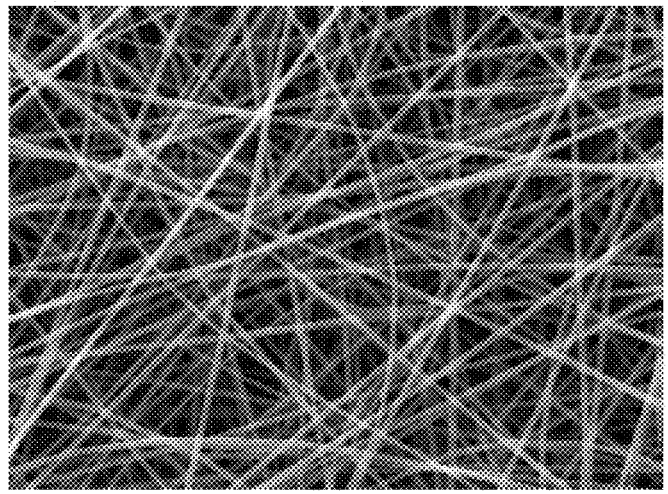
Fig.7B 5w/w%, 40 °C
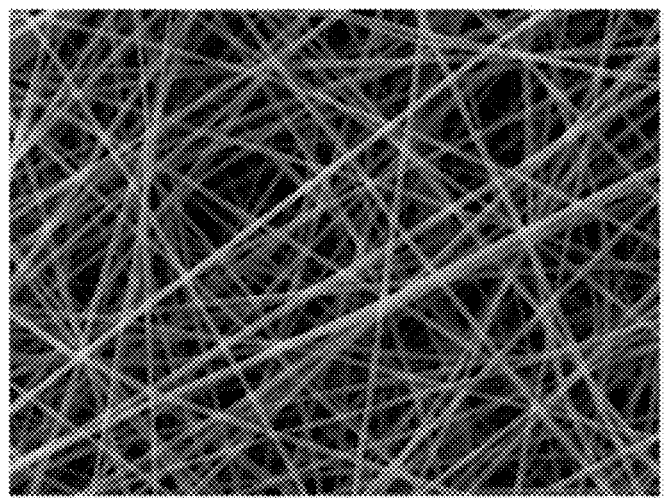
Fig.7C 5w/w%, 60 °C
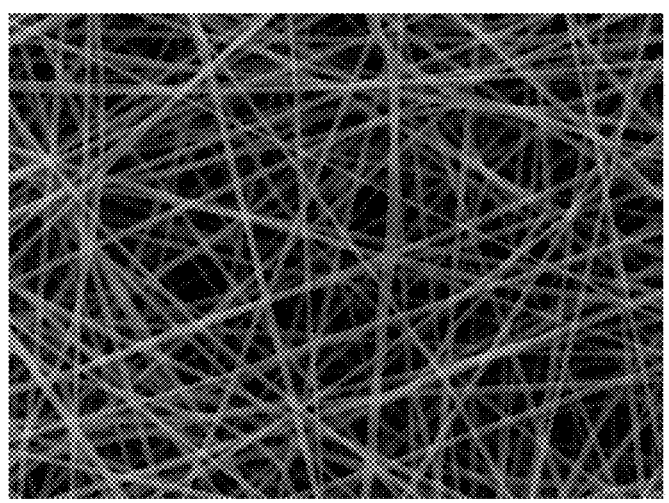

Fig.7D 5w/w%, 80 °C
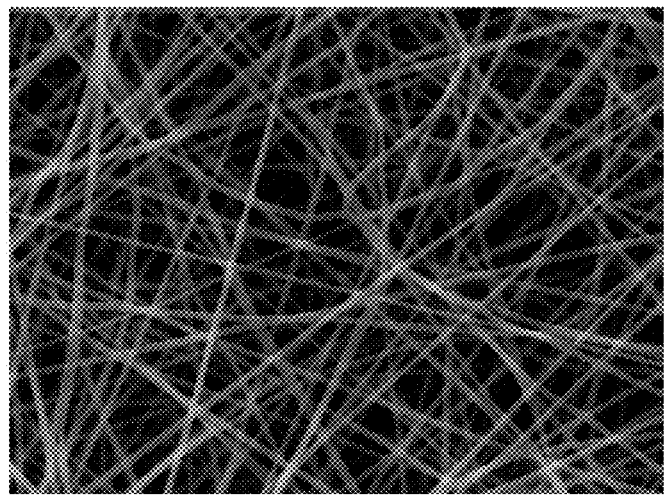
Fig.7E 5w/w%, 100 °C
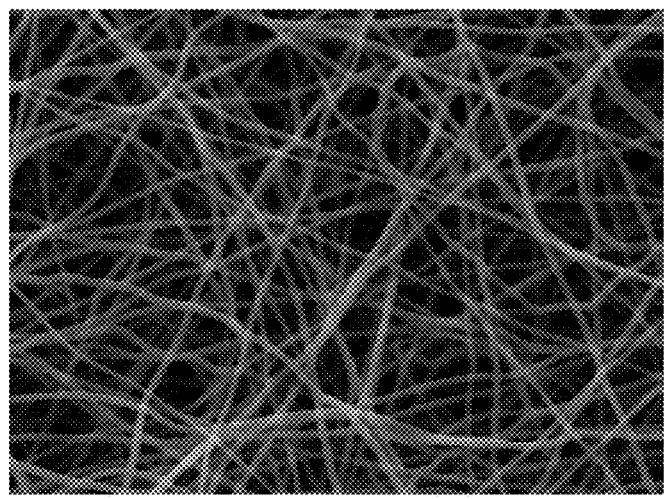

SHEET CONTAINING NANOFIBERS AND METHOD FOR PRODUCING SAME

CROSS REFERENCE TO RELATED APPLICATIONS

The present application is a continuation of International application No. PCT/JP2021/020900, filed Jun. 1, 2021, which claims priority to Japanese Patent Application No. 2020-096415, filed Jun. 2, 2020, the entire contents of each of which are incorporated herein by reference.

BACKGROUND OF THE INVENTION

Field of the Invention

The present invention relates to a sheet comprising nanofibers and a method for producing the same. More specifically, the present invention relates to a sheet comprising nanofibers, the nanofibers comprising a high molecular weight piezoelectric material such as a polylactic acid-based macromolecule, and a method for producing the sheet.

Description of the Related Art

In recent years, many studies have been conducted on scaffolding materials and scaffolds to be used for cell culture in vivo and in vitro in relation to regeneration of biological tissues and the like, and those in various forms have been developed.

For example, JP-A-2019-115322 and JP-A-2019-115323 disclose scaffolding materials using a resin film. JP-B-3023471 discloses a rod-like or plate-like material that promotes the formation of bone. JP-B-3023472 discloses a film for promoting bone formation. JP-A-2014-147342 discloses a cell culture sheet comprising a layer of an inorganic material having micropores. JP-A-2016-214210 discloses a sheet comprising a porous resin film. WO 2007/102606 A discloses a scaffolding material composed of a mass of fibers mainly made of a biocompatible polymer. JP-A-2008-6276 discloses a medical material in which coated fibers formed by coating synthetic resin fibers with titanium or a titanium compound are accumulated. Development of PLLA Nanofiber Scaffold Doped with $BaTiO_3$ by Electrospinning for Bone/Cartilage Tissue Engineering (Report of Research Achievements in Grants-in-Aid for Scientific Research, Jun. 6, 2015) (https://kaken.nii.acjp/ja/file/KAKENHI-PROJECT-24560114/24560114seika.pdf) discloses a nanofiber scaffold in which inorganic nanoparticles ($BaTiO_3$ (BTO)) for promoting bone formation are incorporated.

SUMMARY OF THE INVENTION

The inventors of the present application have noticed that such materials for culturing cells as conventional scaffolding materials and scaffolds have problems to be overcome, and have found the need to take measures therefor. Specifically, the present inventors have found that there are the following problems.

As described above, such materials as conventional scaffolding materials or scaffolds have various forms such as film and porous sheet, and cells can be cultured and proliferated using these materials, but the activation of cells is not sufficient, and there is room for further improvement.

In particular, in the field of regenerative treatment and wound treatment, there has been a demand for the development of materials capable of more positively or actively promoting the activation of cells. In addition, since high adhesion between cells and materials such as scaffolds is required for the proliferation and activation of cells, further improvement of such materials in physical properties such as flexibility is also required.

The present invention has been devised in light of the above problems. That is, a main object of the present invention is to provide a material capable of more positively or actively promoting the proliferation or activation of cells and having improved physical properties such as flexibility.

The inventor of the present application tried to solve the above-described problems by addressing in a new direction, instead of dealing as the extension of the conventional technologies. Specifically, the inventors of the present application have focused on the fact that nanofibers comprising a high molecular weight piezoelectric material generate a potential (or charge) by receiving external energy (for example, tension or stress), and have considered that such a potential can positively or actively promote the proliferation or activation of cells. As a result of intensive studies based on such an idea, the inventors of the present application have found that it is important for more appropriate activation of cells to control physical properties such as the degree of crystallinity of the high molecular weight piezoelectric material to be used, and desirably to increase the degree of crystallinity and the like. Based on such findings, the inventors of the present application have found a method capable of controlling and remarkably improving the degree of crystallinity and the like of a high molecular weight piezoelectric material and capable of imparting physical properties such as flexibility suitable for the activation of cells to a nanofiber sheet in the production of a sheet comprising nanofibers comprising a high molecular weight piezoelectric material and especially in the formation of nanofibers by an electrospinning method (hereinafter, referred to as "electrospinning"). More specifically, the present inventors have found that the heating in advance of a target board for receiving and collecting nanofibers during electrospinning can control or improve the degree of crystallinity and the like of a high molecular weight piezoelectric material contained in the nanofibers and can impart physical properties such as flexibility suitable for the activation of cells to a sheet composed of such nanofibers. As a result, the inventors have reached inventions of a method for producing a sheet-like material comprising nanofibers with which the main object described above is achieved and a sheet material suitable for the activation of cells.

The present invention provides a method for producing a sheet, the method comprising:
  (a) dissolving a high molecular weight piezoelectric material in a solvent to prepare a spinning dope;
  (b) heating a target board; and
  (c) after the heating of the target board, receiving nanofibers formed by electrospinning on the heated target board and molding the nanofibers into a sheet-like form on the heated target board.

(Hereinafter, this method is sometimes referred to as a "production method of the present disclosure".)

In addition, a sheet comprising nanofibers produced by the above production method is provided by the present invention (hereinafter, this sheet is sometimes referred to as "sheet of the present disclosure" or "fiber sheet" or simply "sheet" or "sheet material"). More specifically, there are provided a sheet comprising nanofibers, the nanofibers comprising a high molecular weight piezoelectric material, wherein physical properties such as the degree of crystallinity of the high molecular weight piezoelectric material contained in the nanofibers are controlled, a sheet in which fiber diameters of nanofibers are controlled, and the like.

In the present invention, a material being capable of more positively or actively promoting the proliferation or activation of cells and having improved physical properties such as flexibility, specifically, a sheet comprising nanofibers comprising a high molecular weight piezoelectric material is obtained. It is noted that the effects described in the present specification are merely examples and are not limited, and additional effects may be provided.

BRIEF DESCRIPTION OF THE DRAWINGS

FIG. 6A-6E are SEM images (2000 magnifications) of fiber sheets prepared at a BTEAC addition rate of 4 w/w % and a target temperature of (A) 25° C., (B) 40° C., (C) 60° C., (D) 80° C., or (E) 100° C.;

FIG. 7A-7E are SEM images (2000 magnifications) of fiber sheets prepared at a BTEAC addition rate of 5 w/w % and a target temperature of (A) 25° C., (B) 40° C., (C) 60° C., (D) 80° C., or (E) 100° C.;

DETAILED DESCRIPTION OF THE INVENTION

The present invention relates to a material being capable of more positively or actively promoting the proliferation or activation of cells and having improved physical properties such as flexibility. More specifically, the present invention relates to a sheet comprising nanofibers comprising a high molecular weight piezoelectric material and a method for producing such a sheet. Hereinafter, the method for producing a sheet will be described first, and then the sheet of the present disclosure will be described in detail below.

[Method for Producing Sheet]

The present disclosure relates to a method for producing a sheet comprising nanofibers, the nanofibers comprising a high molecular weight piezoelectric material described in detail below (hereinafter, this sheet may be referred to as a "nanofiber sheet" or a "fiber sheet"), more specifically, a sheet that can be composed of a mass of nanofibers, and the production method characterized mainly by comprising at least the following steps (a) to (c), especially the step (b) described in detail below.

Step (a): dissolving a high molecular weight piezoelectric material in a solvent to prepare a spinning dope containing the high molecular weight piezoelectric material;

Step (b): before forming nanofibers by electrospinning the spinning dope, heating a target board for receiving the nanofibers; and Step (c): receiving nanofibers formed by electrospinning on the target board and molding the nanofibers into a sheet-like form on the heated target board.

Before describing each step in detail, the method for producing a sheet of the present disclosure will be briefly described with reference to FIG. 1.

Figure 1A:
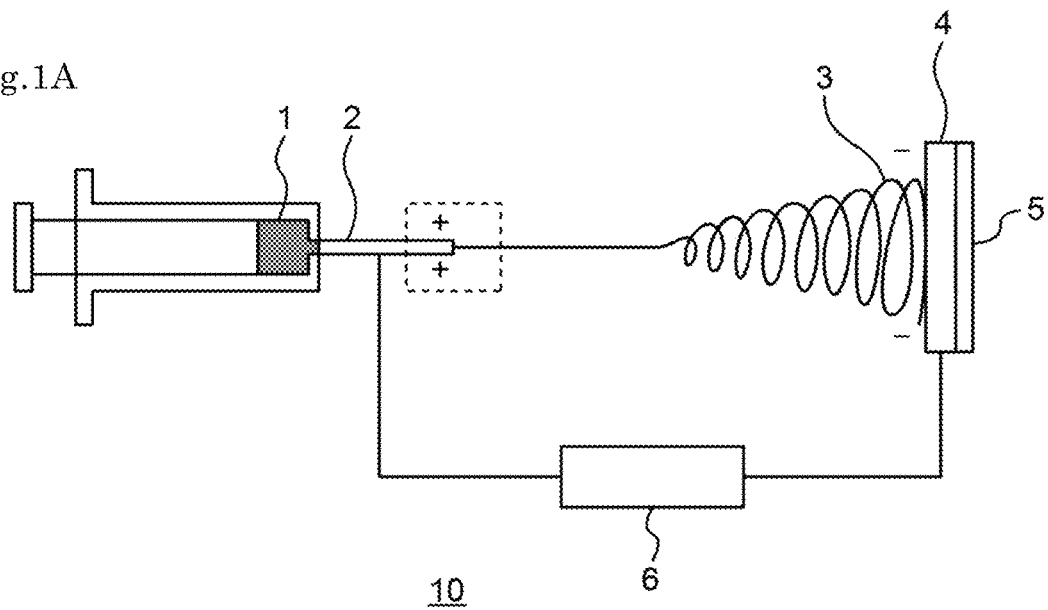
FIG. 1A and FIG. 1B are a schematic view schematically illustrating the production method of the present disclosure.

The method for producing a sheet of the present disclosure is characterized in that electrospinning is used. For example, as illustrated in FIG. 1A, when, for example, a positive voltage is applied to a spinning dope 1 (a solution prepared by dissolving a high molecular weight piezoelectric material in an arbitrary solvent) using, for example, a voltage generator 6, positive charges are collected in droplets of the spinning dope 1 discharged from a tip of a nozzle 2 and the droplets repel each other to be in a conical form (see FIG. 1B (enlarging and schematically illustrating the part surrounded by a broken line in FIG. 1A)). When the repulsive force of the charges exceeds the surface tension, the spinning dope 1 is linearly ejected from the apex of the conical form (see FIG. 1B), and advances in a spiral shape while drawing an arc toward the target board 4 (see FIG. 1A). At this time, as illustrated in FIG. 1A, the target board 4 may, for example, be negatively charged using the voltage generator 6 or grounded.

The spinning dope 1 becomes thinner as it is ejected toward the target board 4, and accordingly, the density of surface charges increases, so that the spinning dope 1 is further drawn and thinned. At this time, the solvent contained in the spinning dope 1 volatilizes, so that ultrafine fibers having a diameter on the order of nanometer (nm), that is, nanofibers 3 can be formed. Thereafter, the target board 4 receives the nanofibers 3, and the nanofibers 3 are collected on a surface facing the nozzle 2, so that a sheet-like material in which the nanofibers 3 can spread and extend two-dimensionally can be formed. The sheet material formed of the mass of the nanofibers 3 that can be formed in this way can also be said in other words to be a nonwoven fabric that can be composed of the nanofibers 3. Such a sheet-like material is also referred to as a "nanofiber sheet" or a "fiber sheet" in the present disclosure.

The number of the nanofibers 3 forming the nanofiber sheet of the present disclosure is not particularly limited, and the nanofiber sheet not only may be composed of one nanofiber but also may be composed of two or more nanofibers. In addition, since by the electrospinning as described above, spinning can usually be performed at room temperature or ambient temperature, it becomes possible to perform spinning using various high molecular weight materials.

Figure 4:
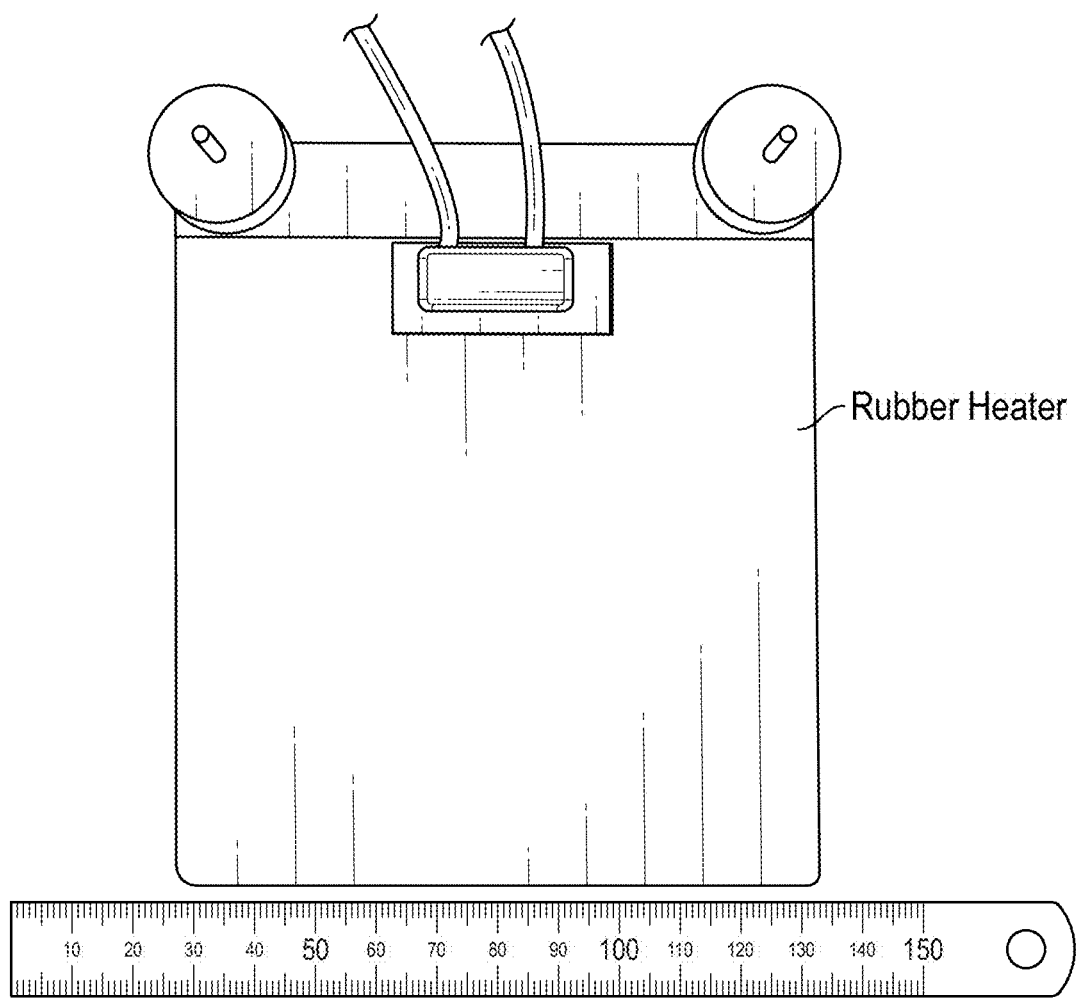
FIG. 4 is a photograph showing a rubber heater.

The method for producing a sheet of the present disclosure is characterized in that, in the electrospinning, the target board 4 is "heated" in advance with, for example, a heater 5 as illustrated in FIG. 1A (more specifically, a rubber heater (see FIG. 4)) before the formation of nanofibers by spinning (step (b)). Such a step of "preheating" or "heating" is an unexpected step that cannot be easily conceived even from the viewpoint of cost by a person skilled in the art who performs electrospinning at room temperature or ambient temperature. By such step (b), the degree of crystallinity and the like of the high molecular weight material that can be contained in the nanofibers, especially the high molecular weight piezoelectric material, can be controlled, and furthermore, the degree of crystallinity of the high molecular weight piezoelectric material can be remarkably improved. As a result, surprisingly, when external energy such as stress or tension is applied to the nanofiber sheet of the present disclosure, electrical stimulation, especially a potential, suitable for the activation, proliferation, or culture of cells can be generated. As a result, the sheet of the present disclosure can be used to promote the activation of cells more positively or actively.

In addition, by such step (b), the fiber diameter and the like of the nanofibers can also be controlled, and furthermore, the fiber diameter of the nanofibers can be made thinner and uniform. As a result, surprisingly, in the nanofiber sheet of the present disclosure, physical properties such as flexural strength, surface roughness, and porosity can be controlled or improved, and furthermore, physical properties such as flexibility can be improved or enhanced. For that, the activation of cells can be further promoted by further improving the adhesion to the cells.

As described above, in the present invention, the above problems can be nicely solved mainly by the step (b) included in the production method of the present disclosure.

As will be described in detail below, the temperature at which the target board 4 is heated in the step (b) is preferably equal to or higher than the temperature of the spinning dope 1, for example, equal to or higher than room temperature or equal to or higher than ambient temperature, and more preferably equal to or higher than the glass transition temperature of the high molecular weight piezoelectric material that can be contained in the spinning dope 1. The temperature at which the target board 4 is heated is, for example, higher than 25° C. and lower than 100° C. When the target board 4 is heated in advance in such a temperature range, physical properties such as the degree of crystallinity, the crystal orientation, and the crystallinity of the nanofibers 3 contained in the sheet can be remarkably improved. In addition, the fiber diameter and the like of the nanofibers 3 can also be controlled, and furthermore, physical properties such as flexibility of the sheet can be further improved.

Hereinafter, the steps (a) to (c) will be described in more detail after explaining terms used in the steps included in the production method of the present disclosure.

Definitions

High Molecular Weight Piezoelectric Material

In the present disclosure, the "high molecular weight piezoelectric material" means a material comprising a macromolecule (or polymer or resin) having a piezoelectric effect or piezoelectricity (hereinafter, sometimes referred to as a "macromolecular piezoelectric"). In the present disclosure, the "piezoelectric effect" means a polarization phenomenon caused by an external force. In addition, the "piezoelectricity" means a property of generating a voltage when a mechanical strain is applied, or conversely a property of generating a mechanical strain when a voltage is applied.

The high molecular weight piezoelectric material is not particularly limited as long as it is a high molecular weight material having the piezoelectric effect or piezoelectricity. Examples thereof include optically active macromolecules, such as polypeptide-based macromolecules (e.g., poly(γ-benzyl glutarate) and poly(γ-methyl glutarate)), cellulose-based macromolecules (e.g., cellulose acetate and cyanoethylcellulose), polybutyric acid-based macromolecules (e.g., poly(β-hydroxybutyric acid)), and polypropylene oxide-based macromolecules, and derivatives thereof. As the high molecular weight piezoelectric material, use of a "polylactic acid-based macromolecule" is preferable from the viewpoint of improving piezoelectricity and the degree of crystallinity.

In the present disclosure, the "polylactic acid-based macromolecule" means "polylactic acid (a macromolecule composed of only repeating units derived from a monomer selected from the group consisting of L-lactic acid and D-lactic acid)", a "copolymer of L-lactic acid or D-lactic acid and a compound copolymerizable with L-lactic acid or D-lactic acid", and mixtures thereof. Among polylactic acid-based macromolecules, "polylactic acid" is particularly preferable, and it is most preferable to use a homopolymer of L-lactic acid (PLLA) and a homopolymer of D-lactic acid (PDLA).

For example, with both of the D-isomer and the L-isomer, the optical purity of polylactic acid (PLA) is 90% by weight or more, preferably 95% by weight or more or 97% by weight or more, more preferably 98% by weight to 100% by weight, even more preferably 99.0% by weight to 100% by weight, and particularly preferably 99.0% by weight to 99.8% by weight.

The optical purity of polylactic acid (PLA) as a piezoelectric material is a value calculated by the following equation as synonymous with enantiomeric excess (e.e.%).

Optical purity (%)=enantiomeric excess (e.e.%)=
{|amount of $L$-isomer−amount of $D$-isomer|/
(amount of $L$-isomer+amount of $D$-isomer)}×
100

As the amount of the L-isomer and the amount of the D-isomer of polylactic acid (PLA), for example, values obtained by a method using high performance liquid chromatography (HPLC) can be used.

Nanofiber

In the present disclosure, "nanofiber" means a fiber having a fiber diameter or a diameter on the order of nanometer (nm), and more specifically means an ultrafine fiber having a fiber diameter of about 1 nm to 1000 nm. Such nanofibers can be produced, for example, by "electrospinning" (also referred to as "electrospinning method") as illustrated in FIG. 1. However, the method for producing nanofibers is not limited to electrospinning, and nanofibers may be produced by a conjugate spinning method (for example, islands-in-the-sea type fibers, split-fiber type fibers, and core-sheath type fibers, especially composite fibers, can be produced) or the like.

Electrospinning

In the present disclosure, "electrospinning" means a method of forming a fiber by spinning by applying a voltage to a "spinning dope".

Spinning Dope

In the present disclosure, "spinning dope" means a liquid prepared by dissolving a high molecular weight piezoelectric material in an arbitrary solvent. However, the production method of the present disclosure does not exclude use of a liquid of a high molecular weight piezoelectric material in a molten state as a spinning dope. In addition, the spinning dope may comprise other components (for example, a surfactant and a conductivity imparting agent), as necessary.

Solvent

In the present disclosure, the "solvent" contained in the spinning dope means a liquid capable of dissolving at least part of the high molecular weight piezoelectric material. In the production method of the present disclosure, the solvent is not particularly limited as long as it can dissolve at least part of the high molecular weight piezoelectric material, and publicly-known organic solvents can be appropriately selected and used.

Surfactant

In the present disclosure, the "surfactant" contained in the spinning dope is not particularly limited, and an alcohol-based surfactant, such as 1,1,1,3,3,3-hexafluoro-2-propanol (HFIP), can be used. Addition of such a surfactant can exhibit such effects as improving compatibility with the high molecular weight piezoelectric material and the solvent and improving stability of spinning.

Conductivity Imparting Agent

In the present disclosure, the "conductivity imparting agent" contained in the spinning dope is not particularly limited, and an ammonium-based conductivity imparting agent, such as benzyltriethylammonium chloride (BTEAC), can be used. Addition of such a conductivity imparting agent can exhibit such effects as promoting electrospinning through improvement of the spinning dope in conductivity and conductance, improving the degree of crystallinity, reducing the values of fiber diameter, standard deviation (SD) thereof and coefficient of variation (CV) thereof, improving degree of crystal orientation, and improving crystallinity.

Sheet

In the present disclosure, the "sheet" means a material that can be composed of nanofibers and can extend two-dimensionally or three-dimensionally (hereinafter, it may also be referred to as "nanofiber sheet" or "fiber sheet"). The nanofiber sheet may be a mass that can be composed of one nanofiber or a plurality of nanofibers. The nanofiber sheet may be in a cloth-like form. The nanofiber sheet may be a nonwoven fabric that can be composed of one nanofiber or a plurality of nanofibers. The thickness of the sheet is not particularly limited, and is, for example, 500 μm or less, preferably 100 μm to 300 μm, and more preferably 200 μm to 300 μm.

Target Board

In the present disclosure, the "target board" means, as represented, for example, by reference number 4 (target board 4) in FIG. 1, a board-like or plate-like member provided to receive nanofibers 3 that can be formed by electrospinning from a spinning dope 1. The target board 4 may be grounded. The target board 4 may have a polarity opposite to that of the spinning dope, or may be charged to a polarity opposite to that of the voltage applied to the spinning dope 1 (see FIG. 1).

The material forming the target board is not particularly limited, and for example, a metal plate of stainless steel, aluminum, or the like is preferable. The thickness of the target board is not particularly limited, and is, for example, 3 mm or more, and preferably 5 mm to 30 mm.

(Regarding Each Step)

Step (a)

The step (a) that can be included in the production method of the present disclosure is a step of dissolving a high molecular weight piezoelectric material in a solvent to prepare a spinning dope containing the high molecular weight piezoelectric material.

The solvent contained in the spinning dope prepared in the step (a) is not particularly limited, but use of 1,3-dioxolane is preferable from the viewpoint of compatibility with the high molecular weight piezoelectric material, particularly compatibility with a polylactic acid (PLA)-based macromolecule (especially, PLLA and PDLA), which is preferable as the high molecular weight piezoelectric material.

The amount of the high molecular weight piezoelectric material contained in the spinning dope is not particularly limited, and the high molecular weight piezoelectric material is contained in the spinning dope in an amount of, for example, 5 w/v % or more, preferably within a range of 10 w/v % to 20 w/v %, and more preferably 10 w/v % to 16 w/v %, based on the total volume of the spinning dope.

The spinning dope or the solvent may contain a surfactant, as necessary. It is preferable to use an alcohol-based surfactant such as 1,1,1,3,3,3-hexafluoro-2-propanol (HFIP) as the surfactant.

The amount of the surfactant contained in the "spinning dope" is not particularly limited, and the surfactant may be contained in an amount of, for example, 50 v/v % or less based on the total volume of the "spinning dope", and is preferably contained in the "spinning dope" within a range of 10 v/v % to 30 v/v %.

The amount of the surfactant contained in the "solvent" is not particularly limited, and the surfactant may be contained in an amount of, for example, 50 v/v % or less based on the volume of the "solvent", and is preferably contained in the "solvent" within a range of 10 v/v % to 30 v/v %.

The spinning dope may contain a conductivity imparting agent, as necessary. It is preferable to use an ammonium-based conductivity imparting agent such as benzyltriethylammonium chloride (BTEAC) as the conductivity imparting agent.

The amount of the conductivity imparting agent contained in the spinning dope is not particularly limited, and the conductivity imparting agent may be contained in an amount of, for example, 5 w/w % or less based on the total weight of the high molecular weight piezoelectric material, and is preferably contained in the spinning dope within a range of 1 w/w % to 4 w/w %, or 1 w/w % to 3 w/w %. It is more preferable that the conductivity imparting agent is contained in the spinning dope within a range of 2 w/w % to 3 w/w %.

In particular, when the conductivity imparting agent is BTEAC, the spinning dope preferably contains BTEAC within a range of, for example, 5 w/w % or less, preferably 4 w/w % or less, and more preferably 3 w/w % or less based on the total weight of the high molecular weight piezoelectric material.

Surprisingly, when BTEAC is contained in the spinning dope in the above-mentioned amount as the conductivity imparting agent, and when particularly 1,3-dioxolane is used as the solvent and used in combination with HFIP as the surfactant, physical properties such as the degree of crystallinity, the degree of crystal orientation, and the crystallinity of the PLA-based macromolecule, especially PLLA and PDLA, which are preferable as the high molecular weight piezoelectric material, can be controlled during the electrospinning in the subsequent step (c), and furthermore, these physical properties can be remarkably improved. The mechanism of this is not limited to a specific theory, and is considered to be due to, for example, an effect of stretching into nanofibers by improving the spinning dope discharge rate.

Step (b)

The step (b), which can be included in the production method of the present disclosure, is a step of, before forming nanofibers by electrospinning a spinning dope, heating in advance a target board for receiving nanofibers (see FIG. 1A).

The step (b) can remarkably improve physical properties such as the degree of crystallinity, the degree of crystal orientation, and the crystallinity of the nanofiber during the subsequent step (c). In addition, the fiber diameter and the like of the nanofibers can also be controlled, and furthermore, physical properties such as remarkably improved flexibility can be imparted to the sheet.

For example, when the target board is heated in the step (b), the degree of crystallinity of the high molecular weight piezoelectric material is improved by, for example, 5% or more in the nanofibers particularly during the subsequent step (c) as compared with the case where the target board is not heated.

The temperature at which the target board is heated in the step (b) is preferably equal to or higher than the temperature of the spinning dope. Here, in electrospinning using a spinning dope, since spinning is usually performed at room temperature or ambient temperature, heating of a target board to a temperature equal to or higher than the temperature of the spinning dope has not been performed at all in conventional spinning processes. In addition, it is surprising to those skilled in the art that heating the target board improves physical properties such as the degree of crystallinity, the degree of crystal orientation, and the crystallinity of nanofibers to be formed, which is an unexpected effect.

The temperature at which the target board is heated in the step (b) is preferably equal to or higher than the glass transition temperature of the high molecular weight piezoelectric material contained in the spinning dope. When the temperature at which the target board is heated is equal to or higher than the glass transition temperature of the high molecular weight piezoelectric material, physical properties such as the degree of crystallinity, the degree of crystal orientation, and the crystallinity of the nanofiber are further remarkably improved.

The temperature at which the target board is heated in the step (b) (hereinafter, sometimes referred to as a "target temperature") is, for example, a temperature higher than 25° C. and lower than 100° C., preferably equal to or higher than 30° C. and lower than 100° C., more preferably equal to or higher than 40° C. and lower than 100° C., or equal to or higher than 80° C. and lower than 100° C., still more preferably equal to or higher than 40° C. and equal to or lower than 90° C., or equal to or higher than 80° C. and equal to or lower than 90° C., and particularly preferably equal to or higher than 60° C. and equal to or lower than 90° C., or equal to or higher than 80° C. and equal to or lower than 90° C. The target temperature is particularly preferably equal to or higher than 60° C. and equal to or lower than 80° C.

The target temperature may be determined by measuring the temperature of a heated target board directly or in contact or in non-contact with a temperature sensor or the like. Alternatively, a set temperature of a temperature controller or the like may be defined as the target temperature.

Step (c)

The step (c) included in the production method of the present disclosure is a step of receiving nanofibers that can be formed by electrospinning on the target board and molding or forming the nanofibers into a sheet-like form on the target board (see FIG. 1A).

Figure 1B:
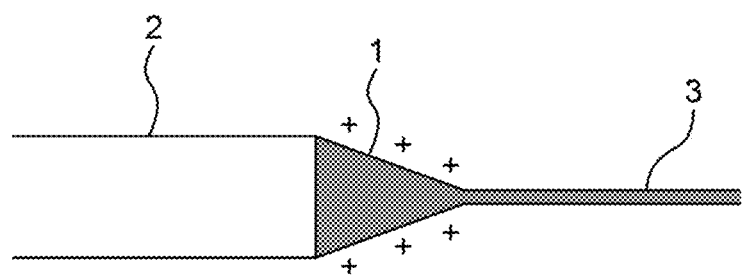

In the step (c), preferably, for example as illustrated, in FIG. 1B, the spinning dope 1 is positively charged by application of a positive voltage to the spinning dope 1, and then the spinning dope 1 is spun by electrospinning to form positively charged nanofibers 3, and for example, the target board 4 is grounded, and thus the nanofibers 3 are collected on the target board 4 and molded or formed into a sheet-like material. For example, the target board 4 may be negatively charged as illustrated in FIG. 1A.

In such step (c), physical properties such as the degree of crystallinity of the high molecular weight piezoelectric material contained in the nanofibers 3 during electrospinning can be controlled and preferably remarkably improved by the target board 4 heated in advance.

As illustrated in FIG. 1A, for example, the target board 4 can be heated with a heater 5 provided on the back surface of the target board 4 (that is, the surface of the target board 4 opposite from the surface facing the nozzle 2), preferably in the center.

The heater 5 is not particularly limited as long as it can heat the target board 4. It is preferable to heat the target board 4 using a heater, such as a rubber heater and, as necessary, a temperature sensor and/or a temperature controller. Here, the temperature of the target board 4 can be adjusted using, for example, a temperature sensor and a temperature controller or the like.

The voltage generator 6 is not particularly limited as long as it can apply a voltage to the spinning dope 1.

The discharge rate of the spinning dope is, for example, 20 µl/min to 60 µl/min. The discharge rate of the spinning dope is preferably 40 µl/min to 60 µl/min, and more preferably 50 µl/min.

The discharge temperature of the spinning dope is, for example, 20° C. to 30° C., and preferably about 25° C. The discharge temperature of the spinning dope may be the same as the temperature of the spinning dope.

Figure 5:
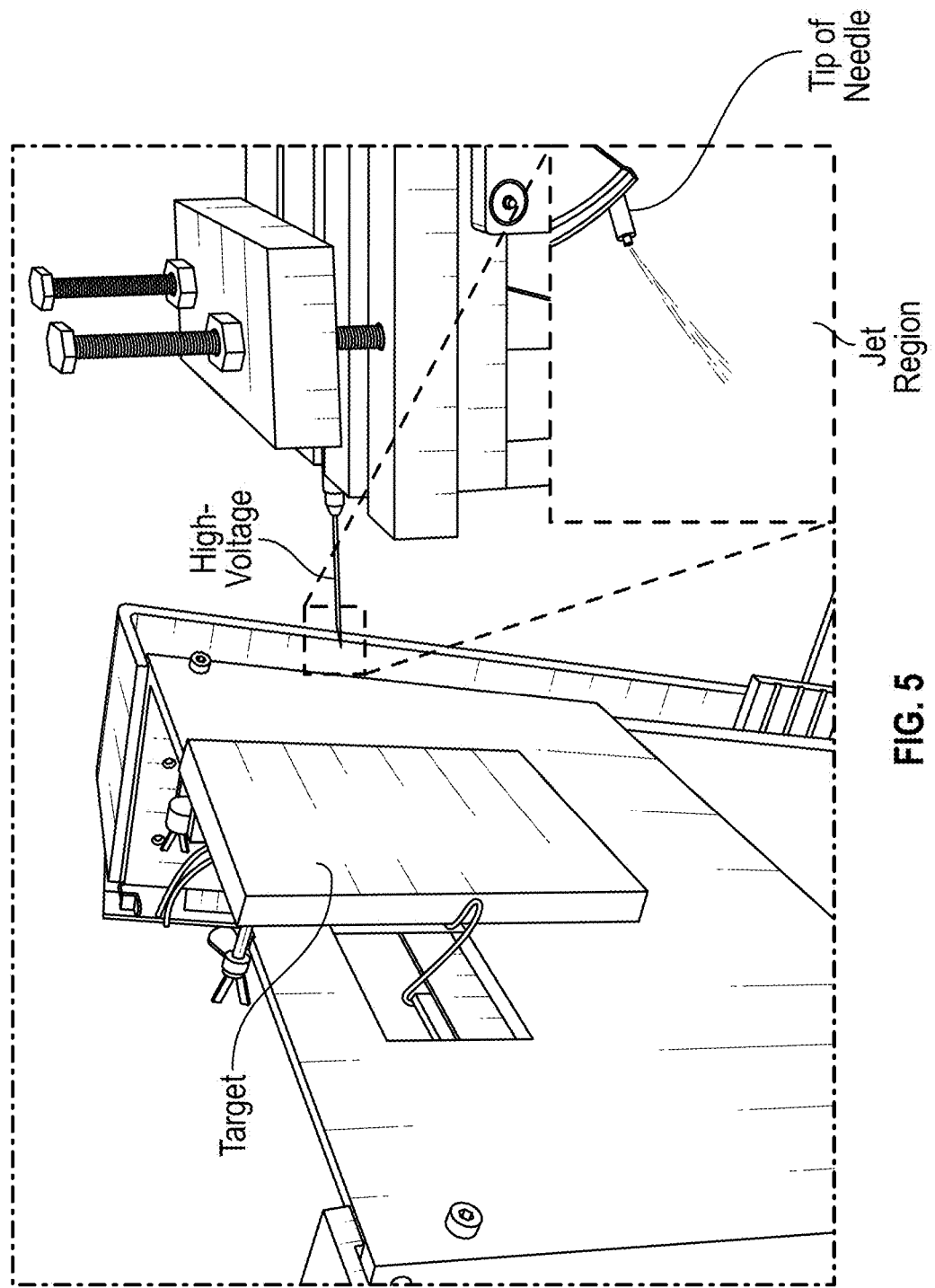
FIG. 5 is a photograph showing a horizontal electrospinning device.

The spinning dope may be ejected in a horizontal direction as illustrated (see FIGS. 1 and 5), but may be ejected in a vertical direction (a direction perpendicular to a horizontal direction). For example, the spinning dope may be ejected downward, in other words, toward the ground.

The concentration of the high molecular weight piezoelectric material that can be contained in the spinning dope is, for example, 20 w/v % or less, preferably 15 w/v % or less, and more preferably 14 w/v %.

The distance to the target board 4 (or the spinning distance) is, for example, 100 mm or less, preferably 80 mm or less, and more preferably 75 mm.

For example, as illustrated in FIG. 1A, the formed nanofibers 3 can be received and collected in a sheet-like form on a surface of the target board 4 (that is, the surface of the target board 4 facing the nozzle 2). The collected nanofibers 3, that is, the mass of the nanofibers 3 may be molded or formed as a sheet-like material, for example, as a nonwoven fabric.

After the step (c), the sheet of the present disclosure may be subjected to a heat treatment called "annealing". Annealing can be performed, for example, by heating the sheet of the present disclosure inside an arbitrary oven. The heat treatment temperature in annealing is not particularly limited, and is, for example, a temperature higher than 25° C. and lower than 100° C., preferably equal to or higher than 30° C. and lower than 100° C., more preferably equal to or higher than 40° C. and lower than 100° C., or equal to or higher than 80° C. and lower than 100° C., still more preferably equal to or higher than 40° C. and equal to or lower than 90° C., or equal to or higher than 80° C. and equal to or lower than 90° C., and particularly preferably equal to or higher than 60° C. and equal to or lower than 90° C., or equal to or higher than 80° C. and equal to or lower than 90° C. Physical properties such as the degree of crystallinity of the nanofibers contained in the sheet of the present disclosure may be further improved by such annealing. The heat treatment temperature in annealing is particularly preferably equal to or higher than 60° C. and equal to or lower than 80° C.

Hereinafter, the sheet of the present disclosure will be described in detail.

[Sheet]

The sheet of the present disclosure can be obtained by the production method described above. As described above, the sheet of the present disclosure is a sheet comprising nanofibers, the nanofibers comprising a high molecular weight piezoelectric material (hereinafter, the sheet of the present disclosure is referred to as a "nanofiber sheet" or a "fiber sheet"). The nanofiber sheet is preferably a mass of nanofibers. The nanofiber sheet is more preferably a nonwoven fabric that can be formed by collecting nanofibers. In the case of a nonwoven fabric, fiber intersections may or may not be physically or chemically bonded.

In the nanofiber sheet, since the nanofibers comprise a high molecular weight piezoelectric material having physical properties such as the degree of crystallinity controlled as described above, when external energy such as tension and stress due to deformation, bending, or strain thereof is applied, a more controlled electric field strength (for example, 1 to 600 mV/mm) can be generated on a surface of the sheet. For example, an electric field strength of 10 to 20 mV/mm at early embryogenesis, 40 to 50 mV/mm at a corneal wound site, and 100 to 150 mV/mm at a skin wound site can be provided.

Therefore, since the nanofiber sheet of the present disclosure can promote the activation of cells by such an electric field and/or potential, the nanofiber sheet can be used for the activation of positive or active cells, or the proliferation or culture of cells, or the like.

Since the sheet of the present disclosure comprises, as ultrafine fibers, nanofibers having a controlled fiber diameter that can be formed by the electrospinning, the sheet is fluffy and soft, that is, does not have a crispy feeling or a crunchy feeling. In addition, since physical properties such as the degree of crystallinity of the high molecular weight piezoelectric material contained in the nanofiber are increased by the step (b) described above, it is possible to promote the activation, proliferation, or culture of cells more positively or actively.

More specifically, when such a nanofiber sheet is used as an alternative to, for example, a bandage, gauze, or adhesive bandage covering a wound, a potential can be generated in accordance with the motion of the body, so that cells can be activated and proliferated faster than before to heal the wound.

The sheet of the present disclosure is characterized in that the degree of crystallinity of the high molecular weight piezoelectric material contained in the nanofibers is, for example, 20% or more, preferably 30% or more, more preferably 40% or more, still more preferably 50% or more, and particularly preferably 55% or more. The degree of crystallinity can be determined by a measurement method such as differential scanning calorimetry (DSC) or X-ray diffraction (XRD). By controlling the degree of crystallinity within the above range, the electric field and/or the potential required for cell activation can be controlled.

Furthermore, the sheet of the present disclosure is characterized in that the fiber diameter of the nanofibers is uniform.

The fiber diameter of the nanofibers is, for example, 800 nm or less. The fiber diameter of the nanofibers is preferably 400 nm to 600 nm, more preferably 400 nm to 550 nm, and particularly preferably about 500 nm. The cross-sectional shape of the nanofibers is not particularly limited, and may be, for example, a substantially circular shape, a substantially rectangular shape, or an irregular shape. In the present disclosure, the fiber diameter of the nanofibers means the maximum dimension in a cross section in a direction perpendicular to the axial direction of a nanofiber. For example, when a nanofiber has a substantially circular cross-sectional shape, the fiber diameter means the largest diameter of the circle.

In the present disclosure, that the fiber diameter of nanofibers is "uniform" means that in one nanofiber, the fiber diameter in the length direction thereof is uniform, that the fiber diameter is uniform among a plurality of nanofibers contained in a sheet, that the fiber diameter in the length direction of one nanofiber is uniform before and after a temperature change (for example, heat treatment by annealing), that the fiber diameter is uniform among a plurality of nanofibers contained in a sheet before and after a temperature change (for example, heat treatment by annealing), and the like. In other words, in the nanofibers of the present disclosure, it is meant, for example, that shrinkage is controlled even when heat is applied, and the fiber diameter is substantially fixed.

When the fiber diameter of the nanofibers contained in the sheet is "uniform" as described above, it is possible to impart appropriate flexural strength, surface roughness, porosity, and the like to the sheet, and furthermore, it is possible to provide a sheet having superior flexibility such as a fluffy texture (a texture with a good touch without a crispy feeling or a crunchy feeling). Due to such flexibility, the adhesion between a sheet surface and cells is further improved, so that the cells can be further activated and the cells are further proliferated.

Examples of an index indicating that the fiber diameter of nanofibers is "uniform" include the average fiber diameter of the nanofibers contained in the sheet. The average fiber diameter of the nanofibers is, for example, 400 nm to 700 nm, preferably 400 nm to 550 nm, and more preferably 450 nm to 550 nm. Here, the average fiber diameter of the nanofibers can be determined by calculation from, for example, a fiber cross-sectional photograph taken with a scanning electron microscope (SEM).

In addition, examples of an index indicating that the fiber diameter of nanofibers is "uniform" include the standard deviation (SD) of the fiber diameter of the nanofibers contained in the sheet. The SD value of the fiber diameter of the nanofibers is, for example, 10 to 150. Here, the SD value of the fiber diameter of the nanofibers may be a standard deviation of the values of the fiber diameter measured at a plurality of positions of one fiber, or may be a standard deviation of the values of the fiber diameter measured at a plurality of positions in a plurality of fibers. Similarly, it may be a standard deviation of the values of the fiber diameter of one nanofiber or a plurality of nanofibers measured before and after a temperature change (for example, heat treatment by annealing).

Another index indicating that the fiber diameter of nanofibers is "uniform" is, for example, a coefficient of variation (CV) (a value obtained by dividing a standard deviation by an average value) of the fiber diameter of the nanofibers contained in the sheet. The CV value of the fiber diameter of the nanofibers is, for example, 5% to 20%. Here, the CV value of the fiber diameter of the nanofibers may be a coefficient of variation of the values of the fiber diameter measured at a plurality of positions in one fiber, or may be a coefficient of variation of the values of the fiber diameter measured at a plurality of positions in a plurality of fibers. Similarly, the coefficient of variation may be a coefficient of variation of the values of the fiber diameter of one nanofiber or a plurality of nanofibers measured before and after a temperature change (for example, heat treatment by annealing).

Here, physical properties such as the degree of crystallinity of the high molecular weight piezoelectric material that can substantially form the nanofibers contained in the sheet of the present disclosure and physical properties such as the flexibility of the sheet caused by the fiber diameter of the nanofibers can be controlled also by adding benzyltriethylammonium chloride (BTEAC), which is a conductivity imparting agent, to the spinning dope in the production process, and furthermore, these physical properties can be improved. In other words, when the sheet of the present disclosure contains BTEAC or an element derived from BTEAC (e.g., nitrogen (N) element or chlorine (Cl) element), physical properties such as the degree of crystallinity of the nanofibers and the flexibility of the sheet can be controlled, and furthermore, these physical properties can be remarkably improved.

From such a viewpoint, the sheet of the present disclosure may be characterized by containing at least one element selected from the group consisting of nitrogen and chlorine. That is, it may be characterized in that such elements as nitrogen and chlorine are derived from benzyltriethylammonium chloride (BTEAC).

Figure 3:
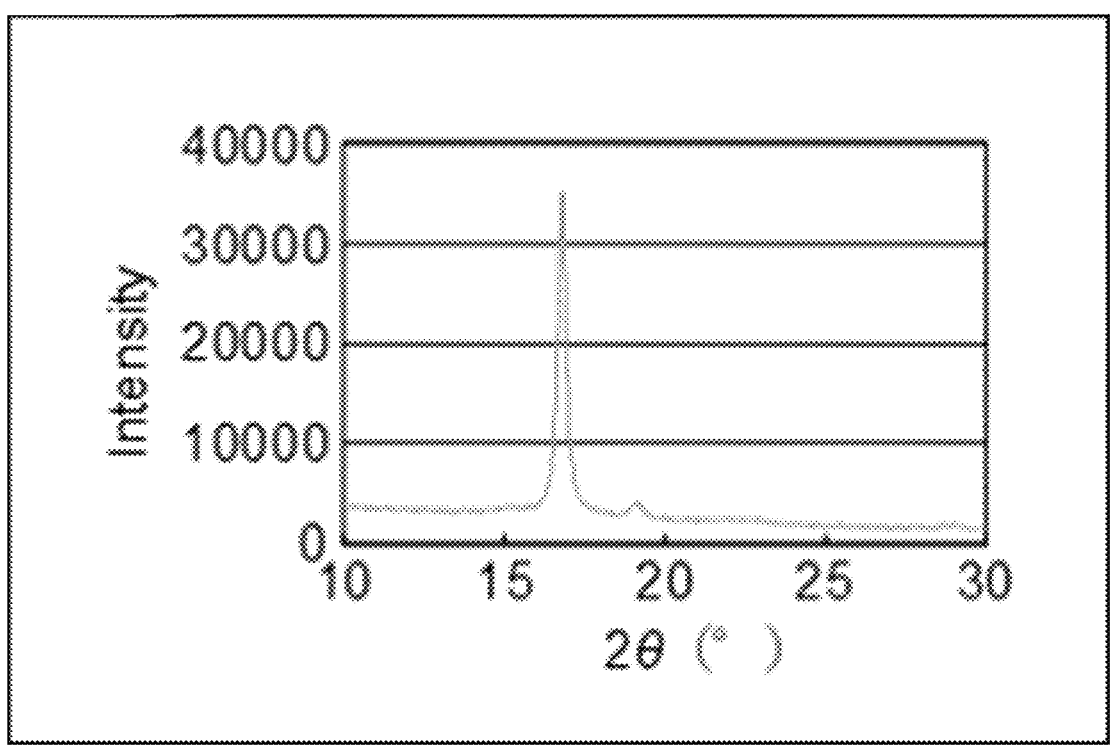
FIG. 3 is a graph showing results of measurement by XRD of PLLA nanofibers contained in the sheet prepared in Example 1.

Further, the sheet of the present disclosure is characterized by having a peak with an intensity of 20,000 or more, preferably 30,000 or more within a range of an angle ($2\theta$) of 15° to 20°, preferably 16° to 18°, or particularly preferably at an angle ($2\theta$) of 16.5° by an X-ray diffraction (XRD) (see, for example, FIG. 3). Such a sheet can have physical properties such as the above-described flexibility as well as a remarkably improved degree of crystallinity and crystallinity. In other words, it is possible to obtain a sheet having remarkably improved physical properties such as the degree of crystallinity and the crystallinity without sacrificing the flexibility of the sheet.

In the sheet of the present disclosure, the high molecular weight piezoelectric material is preferably a polylactic acid-based macromolecule. When the sheet of the present disclosure contains a polylactic acid-based macromolecule, it is possible to achieve physical properties of the nanofibers such as the degree of crystallinity, the degree of crystal orientation, and crystallinity and physical properties of the sheet such as flexibility in a well-balanced manner, and it is possible to obtain a sheet suitable for the activation and/or proliferation or culture of cells.

The sheet of the present disclosure may have orientation. The "orientation" of a sheet means a state in which nanofibers contained in the sheet are preferentially arranged in a specific direction.

Figure 15:
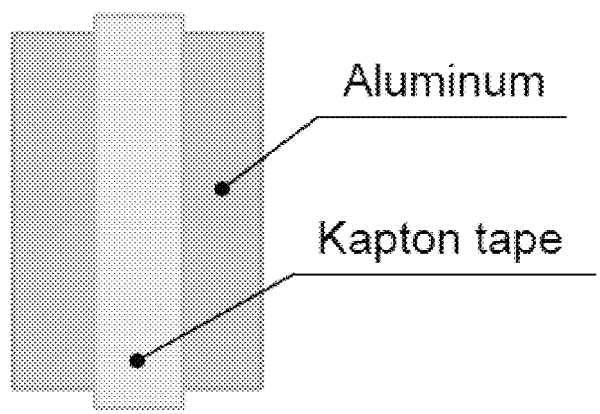
FIG. 15 is a schematic view schematically illustrating a state in which a Kapton tape (insulating tape) is attached to an aluminum target board.

For example, as illustrated in FIG. 15, by arranging an insulating tape (Kapton tape) in a stripe shape on a target board (for example, an aluminum target board) and conducting spinning by electrospinning, nanofibers can be distributed to the left and the right (in a lateral direction) and be oriented.

The orientation of the nanofibers can be defined as an "angle of orientation" and a "degree of orientation", for example, by elliptical approximation. For the elliptical approximation, see Enomae, T., et al., Nordic Pulp and Paper Research Journal, (2006), Vol. 21(2), pp. 253-259.

Figure 18:
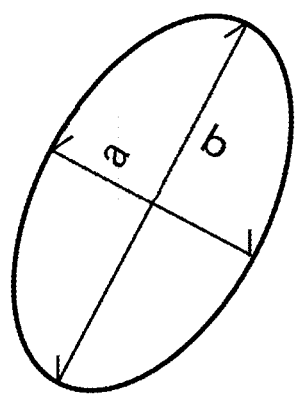
FIG. 18 is a schematic diagram schematically illustrating a minor axis (a) and a major axis (b) of an ellipse used in ellipse approximation.

In the elliptical approximation, the "angle of orientation" means an angle in the minor axis direction (see FIG. 18).

In the elliptical approximation, the "degree of orientation" can be expressed by a ratio of b (major axis)/a (minor axis) (see FIG. 18).

The orientation angle is, for example, ±90° or less, and preferably ±45° or less.

When the angle of orientation is within the above range, the oriented sheet can generate a more appropriate potential upon application of a displacement or a load.

Hereinafter, the sheet of the present disclosure and the method for producing the same will be described in more detail with reference to Examples.

EXAMPLES

Example 1

Figure 2:
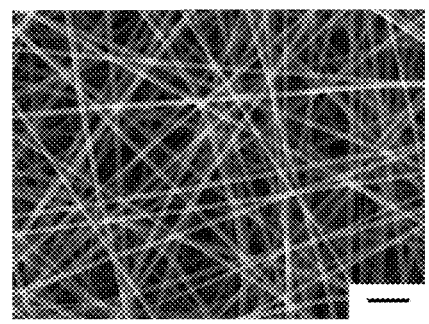
FIG. 2 is a photograph of a sheet surface taken by observing the sheet prepared in Example 1 with a scanning electron microscope (SEM)

A nanofiber sheet was prepared using the electrospinning device shown in FIG. 1. In the present disclosure, the electrospinning device to be used to prepare nanofiber sheets is not limited to that shown in FIG. 1.
(A) Preparation of Spinning Dope
Poly-L-lactic acid (PLLA) as the material of nanofibers, 1,3-dioxolane used as a solvent, and benzyltriethylammonium chloride (BTEAC) as a conductivity imparting agent for improving the conductivity of a solution were stirred using a stirring/defoaming device. Thereafter, 1,1,1,3,3,3-hexafluoro-2-propanol (HFIP) was added as a surfactant, and the PLLA solution stirred was defoamed to prepare a spinning dope. Here, the concentration of PLLA was set to 14 w/v %, the concentration of BTEAC was set to 3 w/w % based on PLLA, and the concentration of HFIP was se to 30 v/v % based on the solvent.
(B) Preheating of Target Board
In the electrospinning device 10 illustrated in FIG. 1, an aluminum board (thickness: 10 mm) was used as the target board 4. A rubber heater was provided as the heater 5 at the center of the back surface (the surface opposite from the surface facing the nozzle 2) of the target board 4. The target board 4 was preheated to 80° C. before spinning by electrospinning.
(C) Electrospinning
By electrospinning using the device 10 illustrated in FIG. 1, a sheet-like PLLA nanofiber sheet was prepared on the target board 4 heated in advance to 80° C. according to the following spinning conditions.
Spinning Conditions
  Nozzle 1: 21 G injection needle with needle tip polished flat
  Discharge rate of spinning dope: 40 µl/min
  Applied voltage: 7 to 11 kV
  Spinning time: 1 minute
  Spinning environment temperature: about 25° C.
  Target nanofiber diameter: 500 nm
Evaluation
The morphology of the surface of the nanofiber sheet prepared above was observed with a scanning electron microscope (SEM). The results are shown in the photograph of FIG. 2 (560±70 nm). The fiber diameter, average fiber diameter, standard deviation (SD) and coefficient of variation (CV) of the PLLA nanofibers contained in the nanofiber sheet were as follows.
  Fiber diameter: 460 nm to 600 nm
  Average fiber diameter: 560 nm
  Standard deviation (SD): 70
  Coefficient of variation (CV): 13%

The degree of crystallinity of the PLLA nanofibers was measured with a differential scanning calorimeter (DSC), and the degree of crystallinity was found to be about 52%.

In addition, when the crystallization temperature of the PLLA nanofibers was measured with a DSC, the crystallization temperature was about 81° C. Here, since it has been reported that the crystallization temperature decreases as crystals are oriented in one direction, the "crystallization temperature" is measured as an index of the "degree of crystal orientation" (Lee, J., K., et al, Structure development and biodegradability of uniaxially stretched poly(L-lactide), European Polymer Journal, Vol. 37, No. 5, (2001), pp. 907-914).

The result of XRD measurement of the PLLA nanofibers contained in the sheet is shown in the graph of FIG. 3 (it was shown that there is a peak with an intensity of 30,000 or more at an angle (2θ) of 16.5°). The crystallinity can be evaluated from the peak intensity and the half-value width of XRD.

The sheet obtained in Example 1 was soft, fluffy, and had a good touch, and did not have a crispy feeling or a crunchy feeling.

Example 2

The nanofiber sheet prepared in Example 1 was placed in an oven and annealed at 80° C. for 10 minutes. The evaluation results were as follows.
  Fiber diameter: 460 nm to 570 nm
  Average fiber diameter: 520 nm
  Standard deviation (SD): 50
  Coefficient of variation (CV): 12%
  Degree of crystallinity: about 50%
  Crystallization temperature: 82.7° C.

In the sheet obtained in Example 2, fibers were hardly shrunk (or were low in shrinkage rate) even after annealing, the sheet was fluffy, had a good touch, was soft, and did not have a crispy feeling or a crunchy feeling.

Comparative Example 1

A nanofiber sheet was prepared in the same manner as in Example 1 except that the target board was not preheated (temperature of target board: about 25° C.). The evaluation results were as follows.
  Fiber diameter: 470 nm to 560 nm
  Average fiber diameter: 510 nm
  Standard deviation (SD): 50
  Coefficient of variation (CV): 10%
  Degree of crystallinity: 43%
  Crystallization temperature: 77.1° C.

Comparative Example 2

The nanofiber sheet prepared in Comparative Example 1 was placed in an oven and annealed at 80° C. for 10 minutes. The evaluation results were as follows.
  Fiber diameter: 450 nm to 730 nm
  Average fiber diameter: 610 nm
  Standard deviation (SD): 140

Coefficient of variation (CV): 23%
Degree of crystallinity: unknown
Crystallization temperature: unknown In the sheets prepared in Comparative Examples 1 and 2, no peak having an intensity of 30,000 or more was detected within a range of an angle (2θ) of 15° to 20° in XRD.

In addition, the sheets obtained in Comparative Examples 1 and 2, especially Comparative Example 2, had a poor touch and had a crispy feeling and a crunchy feeling because the fiber diameter was uneven as compared with the sheets of Examples 1 and 2.

Comparative Example 3

A nanofiber sheet was prepared in the same manner as in Example 1 except that the target board was not preheated and BTEAC was not added (temperature of target board: about 25° C., BTEAC: 0 w/w %). The evaluation results were as follows.
Fiber diameter: 450 nm to 640 nm
Average fiber diameter: 550 nm
Standard deviation (SD): 80
Coefficient of variation (CV): 15%
Degree of crystallinity: 36%
Crystallization temperature: 81.4° C.

Comparative Example 4

The nanofiber sheet prepared in Comparative Example 3 was placed in an oven and annealed at 80° C. for 10 minutes. The evaluation results were as follows.
Fiber diameter: 490 nm to 730 nm
Average fiber diameter: 640 nm
Standard deviation (SD): 170
Coefficient of variation (CV): 27%
Degree of crystallinity: unknown
Crystallization temperature: unknown In the sheets prepared in Comparative Examples 3 and 4, no peak having an intensity of 30,000 or more was detected within a range of an angle (2θ) of 15° to 20° in XRD.

In addition, the sheets obtained in Comparative Examples 3 and 4, especially Comparative Example 4, had a poor touch and had a crispy feeling and a crunchy feeling because the fiber diameter was uneven as compared with the sheets of Examples 1 and 2.

Comparative Example 5

A nanofiber sheet was prepared in the same manner as in Example 1 except that the target board was heated to 100° C. (temperature of target board: 100° C.). As a result, an increase in the diameter of the nanofibers and bending of the nanofibers were observed.

According to SEM observation, nanofibers having a diameter of about 500 nm were prepared under all conditions, but an increase in the diameter of the nanofibers and bending of the fibers were observed at a target temperature of 100° C. regardless of the BTEAC addition rate (Comparative Example 5). This shows that the target temperature needs to be lower than 100° C. in order to avoid the influence of thermal shrinkage. Under the conditions of a target temperature of 25° C. (without preheating) and a BTEAC addition rate of 0 w/w %, the degree of crystallinity and the crystallization temperature of the nanofibers were 36% and 81.4° C., respectively, and no XRD peak was observed (Comparative Example 3). The degree of crystallinity decreased at a target temperature of 25° C. (without preheating) (Comparative Example 1). The degree of crystallinity increased with an increase in the BTEAC addition rate. In addition, although the degree of crystallinity increased at any BTEAC addition rate due to the increase in target temperature, the rate of change in the degree of crystallinity with the increase in target temperature decreased as the BTEAC addition rate was higher. As compared with a target temperature of 60° C., the peak intensity at a target temperature of 80° C. increased to about 40 times, and the half-value width decreased about 60%. In addition, at a target temperature of 60° C. or higher, an increase in peak intensity and a slight decrease in half-value width were observed with an increase in the BTEAC addition rate. It is considered that the increase in crystal size and the crystallization of amorphous parts were promoted with the increase in target temperature. At a target temperature of 80° C. and a BTEAC addition rate of 3 w/w %, the degree of crystallinity was about 52%, the crystallization temperature was about 81° C., and the XRD peak was the highest (FIG. 3), suggesting that the nanofibers prepared had high piezoelectricity (Example 1).

From such results of Example 1, it was suggested that it is possible to produce a nanofiber sheet having high piezoelectricity at a target temperature of 80° C. and a BTEAC addition rate of 3 w/w %.

Since the diameter of collagen fibers as a main component of the extracellular matrix is 50 to 500 nm, it was found that the nanofiber sheets prepared in Examples were superior in affinity with a living body. In addition, it was also found that the nanofiber sheets prepared in Examples can contribute to cell activity and metabolism by electrical stimulation similarly to a piezoelectric tissue such as a bone. Therefore, it was found that the nanofiber sheets of polylactic acid (PLLA) and the like having superior biocompatibility and piezoelectricity produced in Examples are materials superior in tissue regeneration and healing.

Here, electrospinning is commonly used for the production of nanofibers, but the problem is that the degree of crystallinity, the degree of crystal orientation, and the like are lower than those of conventional films and fibers with which a piezoelectric effect has been reported. In addition, although the piezoelectricity of nanofibers can be enhanced by annealing treatment after spinning, there are problems such as increased unevenness of spun nanofibers due to thermal shrinkage and increase or variation in fiber diameter (Comparative Examples 2, 4, and 5). However, according to Examples 1 and 2 of the present invention, such problems of shrinkage and unevenness can also be solved.

The Examples described above merely exemplify the sheet of the present disclosure and the method for producing the same, and the sheet and the production method of the present disclosure are not limited to the embodiments described in the Examples.

Energy Dispersive X-Ray Spectroscopy of Fiber Sheet

In order to check whether BTEAC was incorporated in the fiber sheet, energy dispersive X-ray spectroscopy (EDS or EDX) was performed.

(Experimental Examples A to I)

Fiber sheets prepared in the same manner as in Example 1 under the conditions of a target temperature of 25° C. (without preheating of the target board) and BTEAC addition rates of 0, 1, 2, 3, 4 and 5 w/w % (Experimental Examples A to F), a target temperature of 80° C. and BTEAC addition rates of 0 w/w % and 3 w/w % (Experimental Examples G, H), a target temperature of 100° C. and a BTEAC addition rate of 3 w/w % (Experimental Example I) were subjected to elemental analysis by EDS.

Elements analyzed were carbon (C) element and fluorine (F) element contained in PLLA and a solvent, and chlorine (Cl) element contained in neither PLLA nor a solvent and contained only in BTEAC. The results are shown in Table 1 below.

TABLE 1

EDS Measurement Results

| Experimental Example | Target temperature (° C.) | BTEAC (w/w %) | C (Element %) | F (Element %) | Cl (Element %) |
|---|---|---|---|---|---|
| A | 25 | 0 | 31.76 | 5.31 | N.D. |
| B | 25 | 1 | 28.77 | 8.98 | 0.12 |
| C | 25 | 2 | 29.13 | 7.65 | 0.11 |
| D | 25 | 3 | 29.76 | 7.98 | 0.16 |
| E | 25 | 4 | 27.99 | 19.00 | 0.3 |
| F | 25 | 5 | 29.6 | 11.41 | 0.34 |
| G | 80 | 0 | 28.04 | 8.81 | N.D. |
| H | 80 | 3 | 29.15 | 9.38 | 0.23 |
| I | 100 | 3 | — | — | N.D. |

N.D. : equal to or less than detection limit
—: not measurable

From the results in Table 1, it was found that in the fiber sheets of Experimental Examples A and G in which the BTEAC addition rate was 0 w/w %, the chlorine (Cl) element derived from BTEAC was equal to or less than the detection limit and was not substantially detected.

In the nanofiber sheets of Experimental Examples B to F and H in which BTEAC was added, the chlorine (Cl) element derived from BTEAC was detected. The Cl element is related to the presence of BTEAC, the dielectric constant, etc. For the nanofiber sheets of Experimental Examples B to F and H in which BTEAC was added, the presence of the nitrogen (N) element derived from BTEAC was also confirmed.

Among the fiber sheets of Experimental Examples A to I shown in Table 1, the fiber sheet of "Experimental Example H" corresponds to the fiber sheet of "Example 1" because the target temperature is 80° C.

The fiber sheet of "Experimental Example G" is referred to as the fiber sheet of "Example 3" because the target temperature is 80° C.

Among the fiber sheets of Experimental Examples A to I shown in Table 1, the fiber sheets of "Experimental Examples A to F" do not correspond to the invention of the present application because the target temperature is 25° C. (without preheating of the target board).

The fiber sheet of "Experimental Example A" corresponds to the fiber sheet of "Comparative Example 3", and the fiber sheet of "Experimental Example D" corresponds to the fiber sheet of "Comparative Example 1". The fiber sheet of "Experimental Example I" corresponds to the fiber sheet of "Comparative Example 5".

In the fiber sheet of "Experimental Example I", a spider net was formed by splitting of fibers, and thus the value of Cl element was equal to or less than the detection limit.
Evaluation of BTEAC Addition Rate and Target Temperature PLLA was dissolved in 1,3-dioxolane (DOL) and 1,1,1,3,3,3-hexafluoro-2-propanol (HFIP) to prepare a PLLA solution. The solution concentration of PLLA was set to 14 w/v %, and the DOL/HFIP mixing ratio was set to 70/30. The temperature of the target board (the target temperature) was set to 25° C. (without preheating the target board), 40° C., 60° C., 80° C., and 100° C. using a rubber heater (see FIG. 4). The distance to the target board (the spinning distance) was set to 50 mm. Further, spinning was performed for 1 minute at a discharge rate of 40 µl/min and an applied voltage of 7.2 to 10.7 kV (see FIG. 5). After spinning, the morphology of the fibers was observed by SEM, and the degree of crystallinity was evaluated by differential scanning calorimetry (DSC).

(Spinning Conditions)
Solution Conditions
  PLLA concentration: 14 w/v %
  Solvent: DOL/HFIP (70/30)
  BTEAC concentration: 4 w/w % or 5 w/w %
Electrospinning Spinning Conditions
  Target temperature: 25 (without preheating), 40, 60, 80 or 100° C.
  Distance from tip of nozzle to target board: 50 mm
  Applied voltage: 7.2 to 10.7 kV
  Discharge rate (flow rate): 40 µl/min
  Spinning temperature: about 25° C.
  Humidity: 7 to 16%

SEM images at each target temperature at the BTEAC addition rates of 4 w/w % and 5 w/w % are shown in FIGS. 6 and 7, respectively (2000 magnifications).

At both the BTEAC addition rates of 4 w/w % and 5 w/w %, it was observed that the fibers had been remarkably curved at the target temperature of 100° C. (see FIGS. 6(E) and 7(E)).

Figure 8:
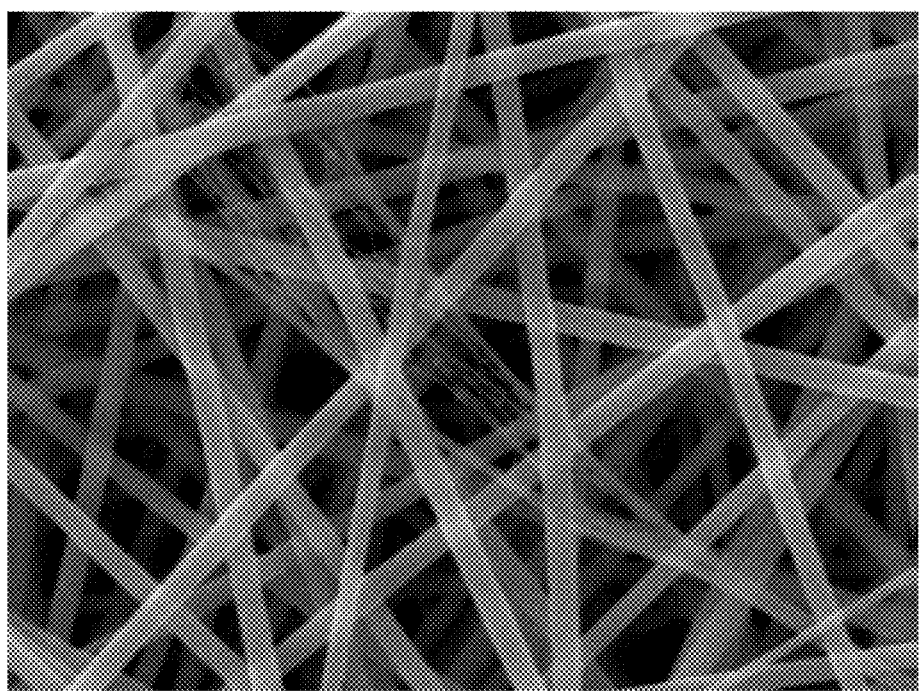
FIG. 8 shows an SEM image of a fiber sheet prepared at a BTEAC addition rate of 4 w/w % and a target temperature of 25° C. (without preheating) (5000 magnifications)

At both the BTEAC addition rates of 4 w/w % and 5 w/w %, it was observed that the fibers had been broken at the target temperature of 25° C. (without preheating) (see FIGS. 6(A) and 7(A)). In particular, an SEM image at 5000 magnifications of fibers prepared at a BTEAC addition rate of 4 w/w % and a target temperature of 25° C. (without preheating) is shown in FIG. 8. In FIG. 8, the fibers collapsed in a cobweb-like form. In other words, the fibers were split to form a spider net. It was found that when the BTEAC addition rate was 3 w/w % or less, such collapse of fibers was not observed over the range where the target temperature was higher than 25° C. and lower than 100° C. (see Example 1 and FIG. 2).

From the above, it was found that the BTEAC addition rate is preferably 5 w/w % or less or less than 5 w/w %, particularly 4 w/w % or less or 3 w/w % or less, and the target temperature is more preferably higher than 25° C. and lower than 100° C.

Figure 9:
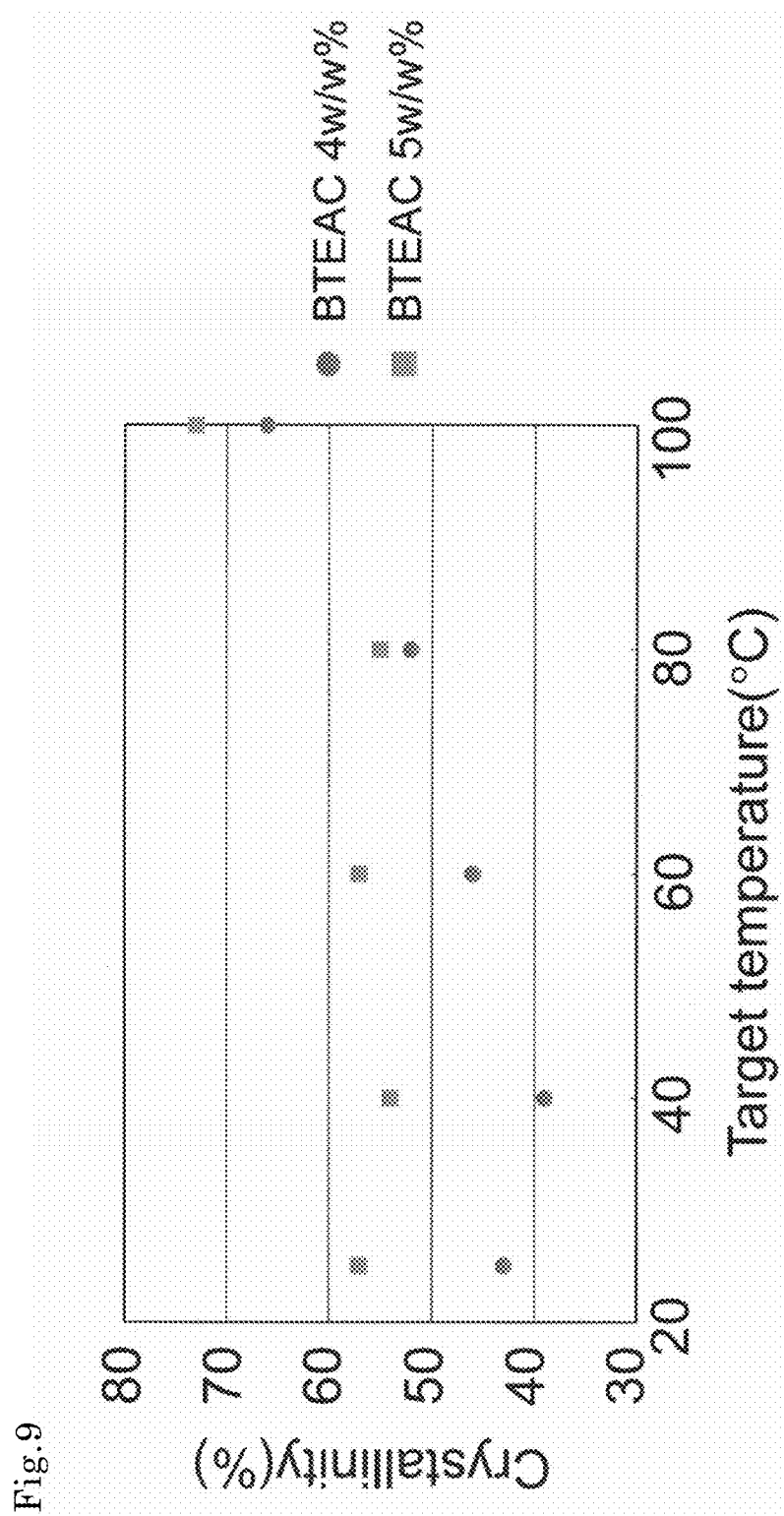
FIG. 9 is a graph showing the degree of crystallinity calculated from the DSC measurement results (BTEAC addition rate: 4 w/w % and 5 w/w %)
Figure 10:
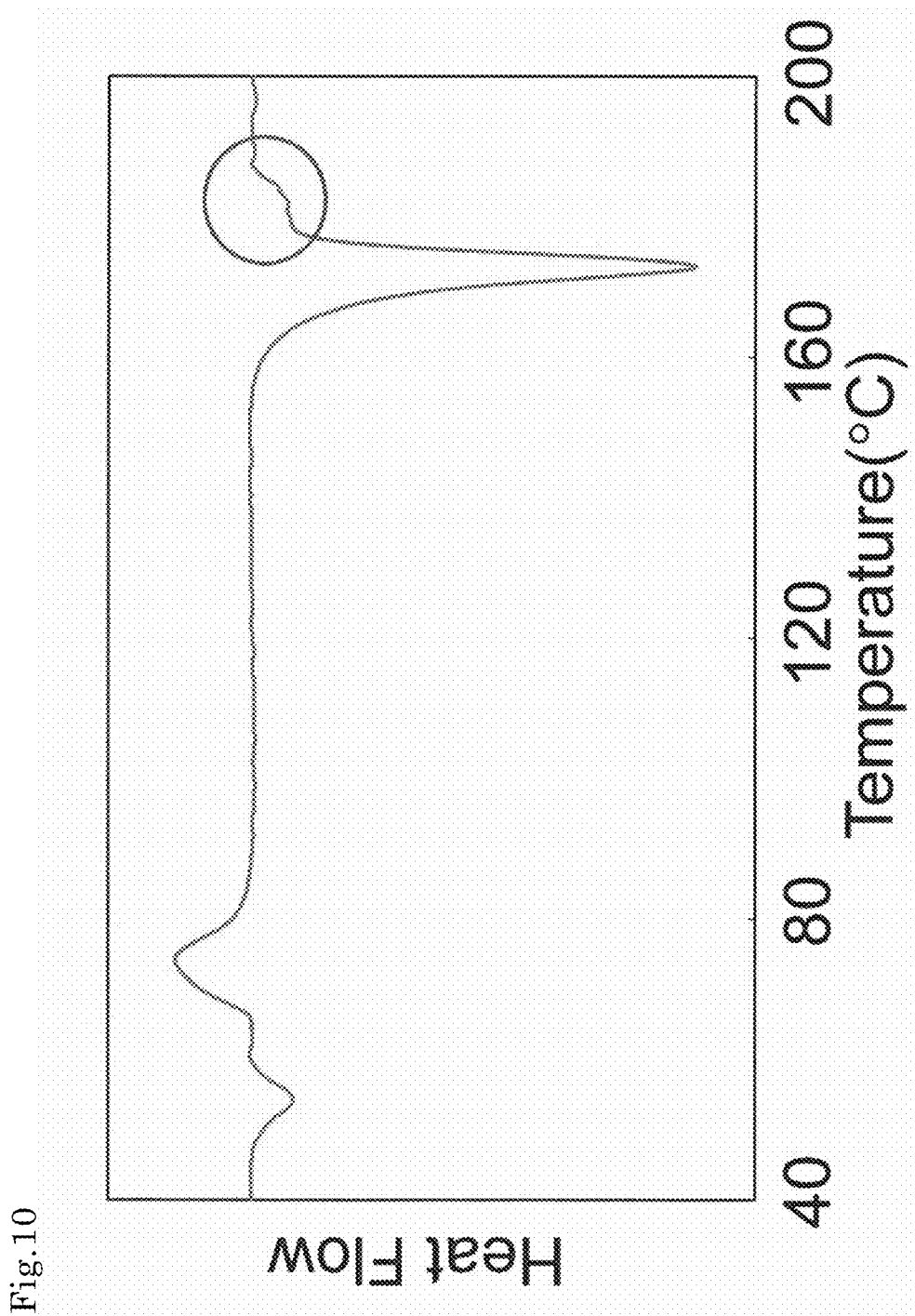
FIG. 10 shows a DSC curve (BTEAC addition rate: 4 w/w %)

(Degree of Crystallinity)
The degrees of crystallinity calculated from the DSC measurement results are shown in FIG. 9. From the results shown in FIG. 9, it was found that the degree of crystallinity also increases as the BTEAC addition rate increases. Under the condition of BTEAC 4 w/w % or more, a peak derived from BTEAC was observed near the peak of the amount of heat of crystal fusion derived from PLLA particularly at both 4 w/w % and 5 w/w % (see FIG. 10).

Figure 11:
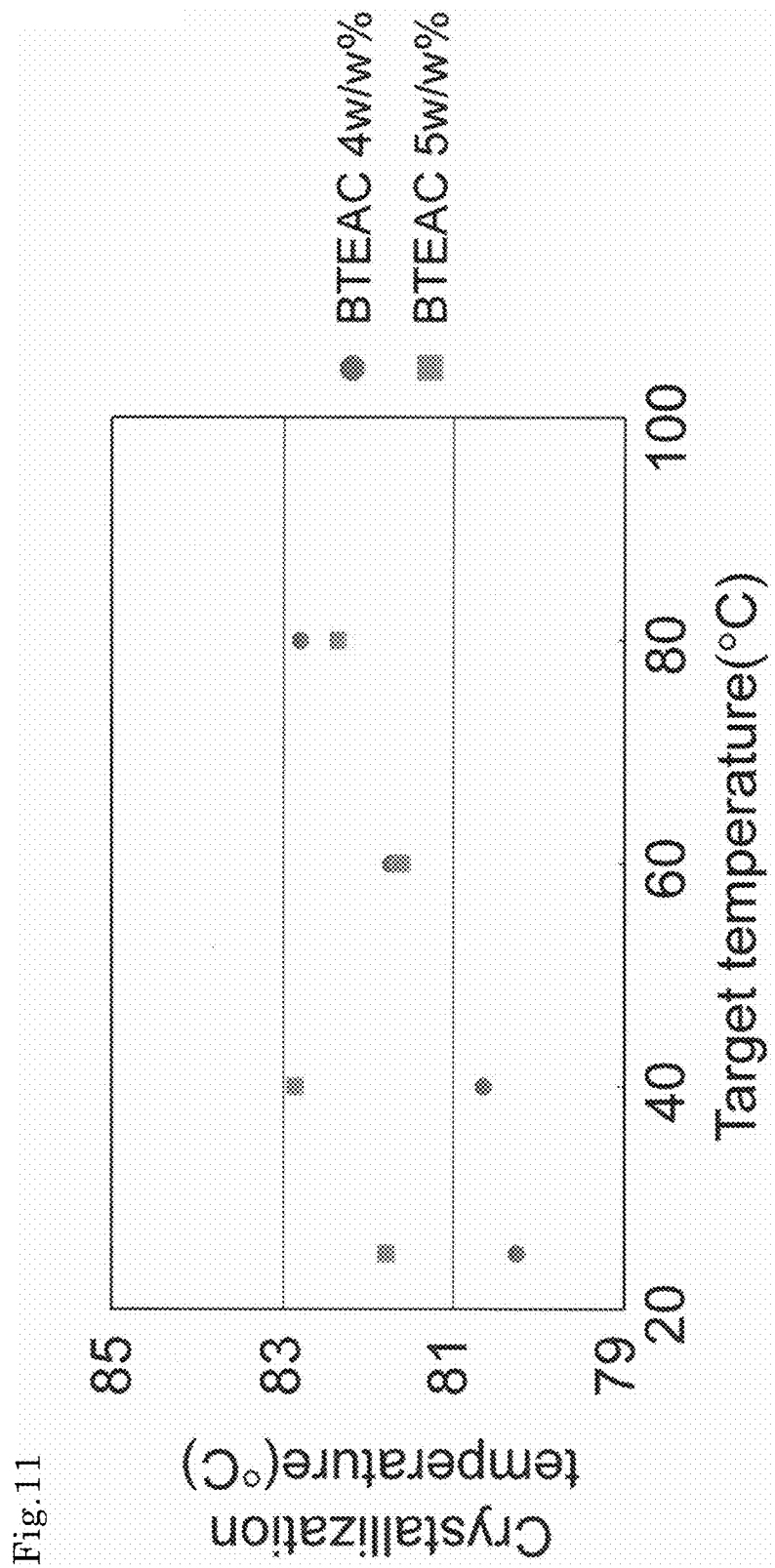
FIG. 11 is a graph showing crystallization temperatures calculated from DSC measurement results (BTEAC addition rates: 4 w/w % and 5 w/w %)

The crystallization temperatures calculated from the DSC curves are shown in FIG. 11. When the BTEAC addition rate was 4 w/w %, the crystallization temperature tended to increase as the target temperature increased.

It was found that at a BTEAC addition rate of 5 w/w %, the crystallization temperature was around 82° C. at any target temperature.

From the results shown in FIG. 11, it was found that the crystal orientation increased as the BTEAC addition rate increased up to about 5 w/w %.
(FTIR Measurement)

Figure 12:
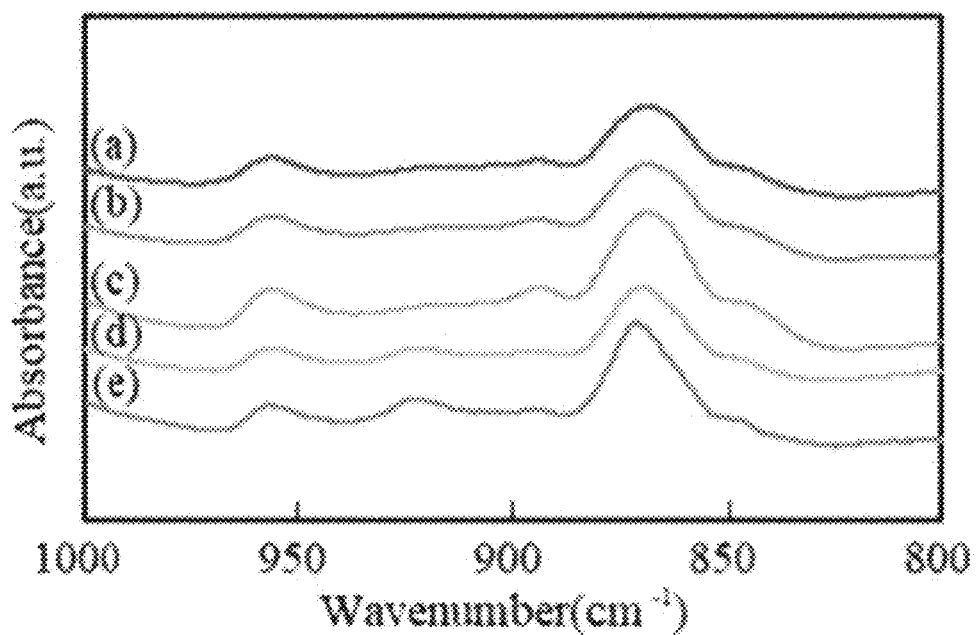
FIG. 12 shows FTIR measurement results at a BTEAC addition rate of 3 w/w % ((a) 25° C., (b) 40° C., (c) 60° C., (d) 80° C., (e) 100° C.)
Figure 13:
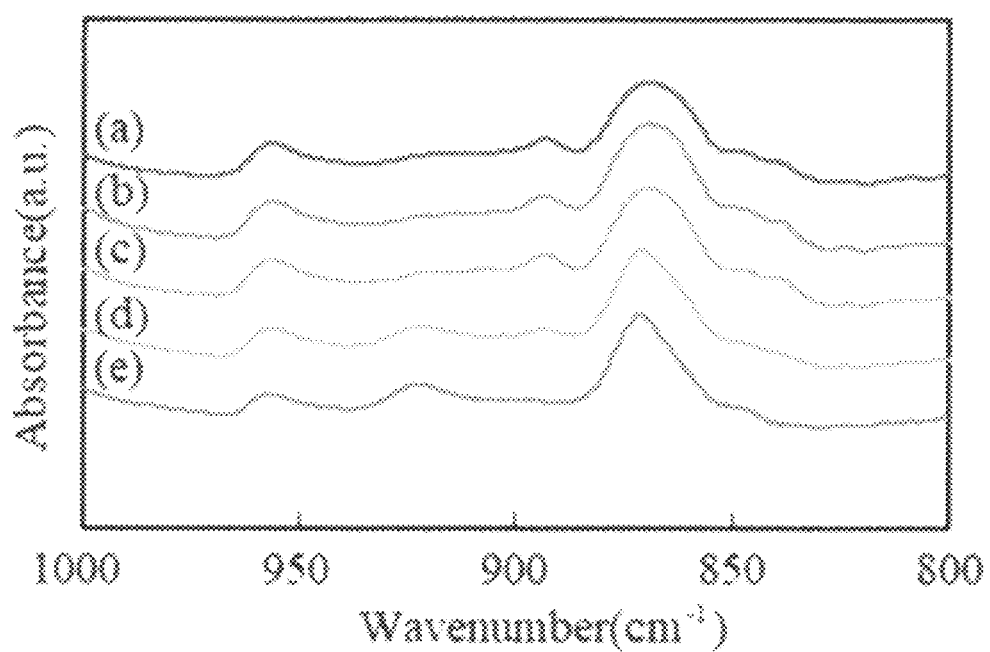
FIG. 13 shows FTIR measurement results at a BTEAC addition rate of 4 w/w % ((a) 25° C., (b) 40° C., (c) 60° C., (d) 80° C., (e) 100° C.)
Figure 14:
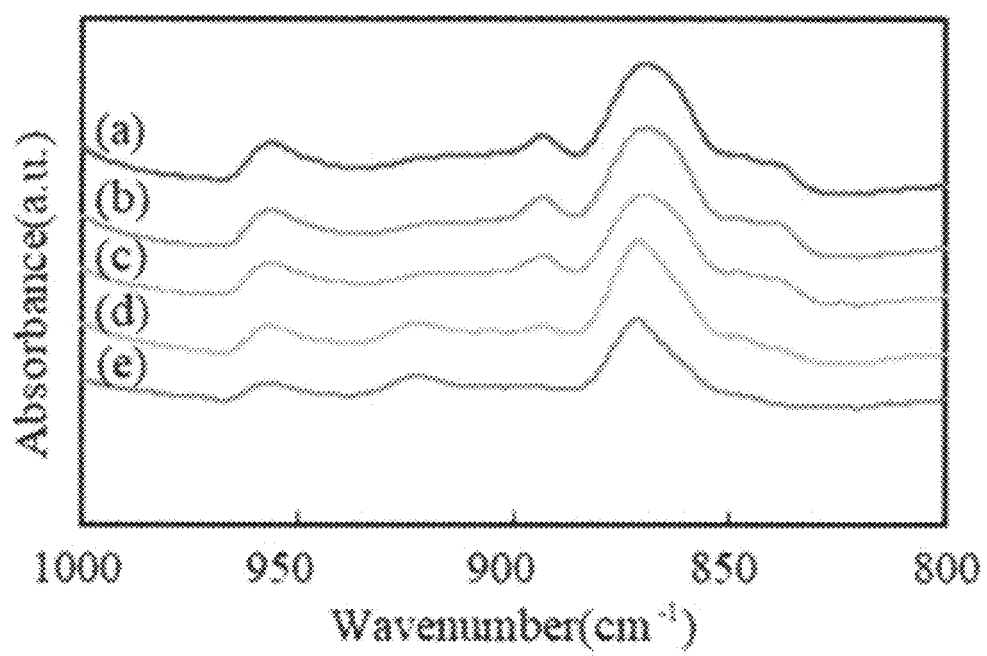
FIG. 14 shows FTIR measurement results at a BTEAC addition rate of 5 w/w % ((a) 25° C., (b) 40° C., (c) 60° C., (d) 80° C., (e) 100° C.)

The FTIR measurement results with the BTEAC addition rate of 3 w/w % are shown in FIG. 12 (target temperature: (a) 25° C., (b) 40° C., (c) 60° C., (d) 80° C., (e) 100° C.), the FTIR measurement results with the BTEAC addition rate of 4 w/w % are shown in FIG. 13 (target temperature: (a) 25° C., (b) 40° C., (c) 60° C., (d) 80° C., (e) 100° C.), and the FTIR measurement results with the BTEAC addition rate of 5 w/w % are shown in FIG. 14 (target temperature: (a) 25° C., (b) 40° C., (c) 60° C., (d) 80° C., (e) 100° C.).

The waveform of FTIR was not affected by the addition of BTEAC. A peak around 923 cm$^{-1}$, which is a peak derived from an a crystal, was observed under the conditions of target temperatures of 80° C. and 100° C.

From the results shown in FIGS. 12 to 14, it was found that the proportion of the a crystal tends to increase, in other words, the crystal grows more, as the target temperature increases. In particular, it has been found that a target temperature of 80° C. or higher, particularly around 80° C., is effective.

Preparation of Oriented Fiber Sheet

An oriented fiber sheet was prepared as a sample for piezoelectricity evaluation.

(Oriented Fiber Sheet A)

An oriented fiber sheet A (BTEAC addition rate: 3 w/w %) was produced by performing spinning by electrospinning in the same manner as in Example 1 except that an insulating tape (Kapton tape) having a width of 15 mm was attached to an aluminum target board in a stripe shape (see FIG. 15), and the temperature of the target board was set to 86° C.

Since an electric attracting force can be weakened by attaching an insulating tape (Kapton tape) to a target board, fibers can be distributed and oriented in the lateral direction (or left and right) on an insulator.

(Oriented Fiber Sheet B)

An oriented fiber sheet B (BTEAC addition rate: 0 w/w %) was produced by performing spinning by electrospinning in the same manner as in Example 1 except that an insulating tape (Kapton tape) having a width of 15 mm was attached to an aluminum target board in a stripe shape (see FIG. 15), the temperature of the target board was set to 25° C. (without preheating), and BTEAC was not added.

Figure 16:
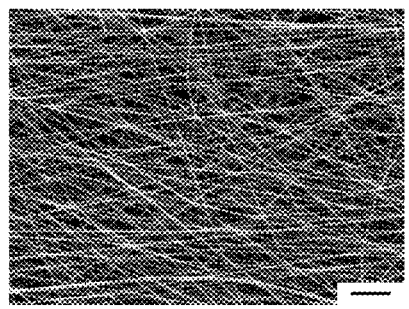
FIG. 16 shows an SEM image of oriented fiber sheet A (Example) (1000 magnifications, Bar: 10 µm)

FIG. 16 shows an SEM image of oriented fiber sheet A (Example) (1000 magnifications, Bar: 10 μm). From FIG. 16, it was confirmed that fibers were oriented in the left-right direction (the lateral direction) of the SEM image in the oriented fiber sheet A.

Figure 17:
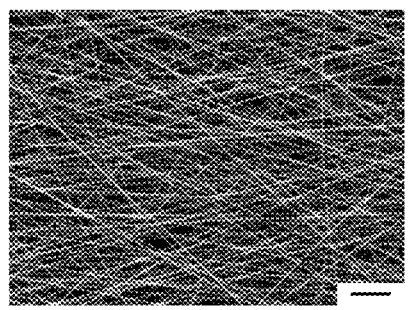
FIG. 17 shows an SEM image of oriented fiber sheet B (Comparative Example) (1000 magnifications, Bar: 10 µm)

FIG. 17 shows an SEM image of oriented fiber sheet B (Comparative Example) (1000 magnifications, Bar: 10 μm). From FIG. 17, it was confirmed that fibers were oriented in the left-right direction (the lateral direction) of the SEM image also in the oriented fiber sheet B.

The SEM images of FIGS. 16 and 17 were binarized and subjected to FFT processing, and then a power spectrum for each angle was calculated. Thereafter, the "angle of orientation" and the "degree of orientation" were calculated by elliptical approximation. For the elliptical approximation, see Enomae, T., et al., Nordic Pulp and Paper Research Journal, (2006), Vol. 21(2), pp. 253-259.

In the elliptical approximation, the "angle of orientation" means an angle in the minor axis direction.

In the elliptical approximation, the "degree of orientation" can be expressed by a ratio of b (major axis)/a (minor axis).

In the oriented fiber sheet A shown in FIG. 16, the angle of orientation was 5.6° and the degree of orientation was 2.7.

In the oriented fiber sheet B shown in FIG. 17, the angle of orientation was 2.8° and the degree of orientation was 2.6.

In this way, the oriented fiber sheets A (Example) and B (Comparative Example) having the same degree of orientation and different angles of orientation were successfully prepared.

For the oriented fiber sheets A and B, non-oriented fiber sheets (nonwoven fabrics) A' and B' not oriented were prepared, respectively, and compared with each other.

Specifically, the non-oriented fiber sheets (nonwoven fabrics) A' and B' were prepared in the same manner as the oriented fiber sheets A and B without using an insulating tape (Kapton tape), and compared with the oriented fiber sheets A and B, respectively. The results of crystal evaluation comparing "degree of crystallinity", "crystallization temperature", "crystal type and crystal growth evaluation" and the like are shown in the following table.

TABLE 2

Degree of Crystallization

| Fiber sheet | Target temperature | BTEAC | Degree of crystallization |
|---|---|---|---|
| A (oriented) | 86° C. | 3 w/w % | 53% |
| A' (not oriented) | 86° C. | 3 w/w % | 51% |
| B (oriented) | 25° C. | 0 w/w % | 35% |
| B' (not oriented) | 25° C. | 0 w/w % | 36% |

From the comparison between the oriented fiber sheet A and the non-oriented fiber sheet A' and the comparison between the oriented fiber sheet B and the non-oriented fiber sheet B', it was found that there was no significant difference in the degree of crystallinity and they were almost the same.

TABLE 3

Crystallization Temperature

| Fiber sheet | Target temperature | BTEAC | Crystallization temperature |
|---|---|---|---|
| A (oriented) | 86° C. | 3 w/w% | 82.0° C. |
| A' (not oriented) | 86° C. | 3 w/w% | 82.1° C. |
| B (oriented) | 25° C. | 0 w/w% | 81.7° C. |
| B' (not oriented) | 25° C. | 0 w/w% | 81.4° C. |

From the comparison between the oriented fiber sheet A and the non-oriented fiber sheet A' and the comparison between the oriented fiber sheet B and the non-oriented fiber sheet B', it was found that there was no significant difference in "crystallization temperature" and they were almost equivalent in this respect.

TABLE 4

Type of Crystal and Crystal Growth Evaluation

| Fiber sheet | Target temperature | BTEAC | Peak intensity | Half-value width |
|---|---|---|---|---|
| A (oriented) | 86° C. | 3 w/w% | 24739 counts | 0.27° |
| A' (not oriented) | 86° C. | 3 w/w% | 24816 counts | 0.25° |
| B (oriented) | 25° C. | 0 w/w% | N.D. | N.D. |
| B' (not oriented) | 25° C. | 0 w/w% | N.D. | N.D. |

N.D.: equal to or less than detection limit

From the comparison between the oriented fiber sheet A and the non-oriented fiber sheet A' and the comparison between the oriented fiber sheet B and the non-oriented fiber sheet B', it was found that there was no significant difference in "the type of crystals and crystal growth evaluation" (specifically, "peak intensity" and "half-value width").

From these crystal evaluations, it was found that the crystal states of the oriented fiber sheets (A, B) and the non-oriented fiber sheets (A', B') were equivalent to each other.

Preparation of Piezoelectricity Test Piece

Figure 19:
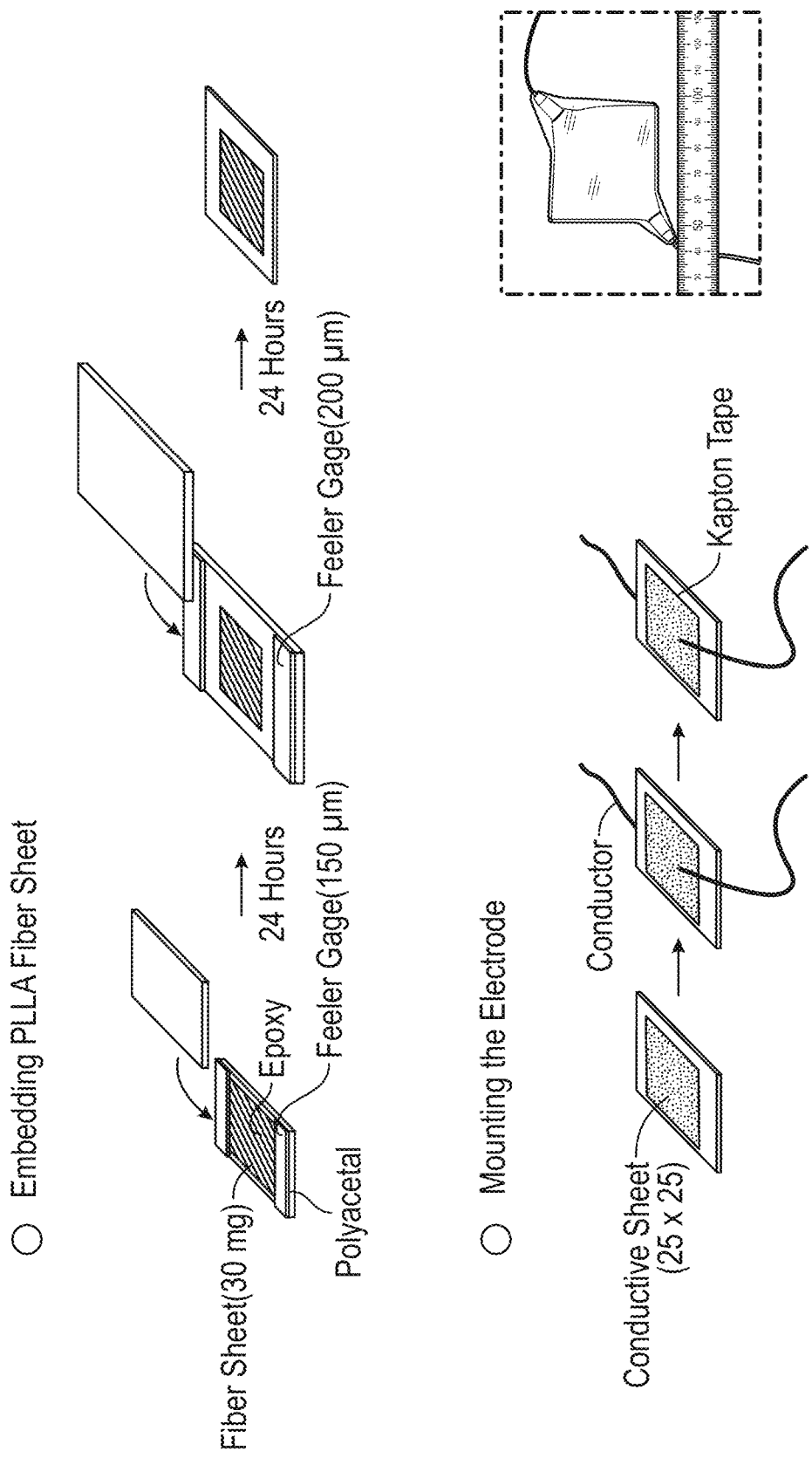
FIG. 19 is a schematic view schematically illustrating the preparation of a piezoelectricity testing piece.
Figure 20:
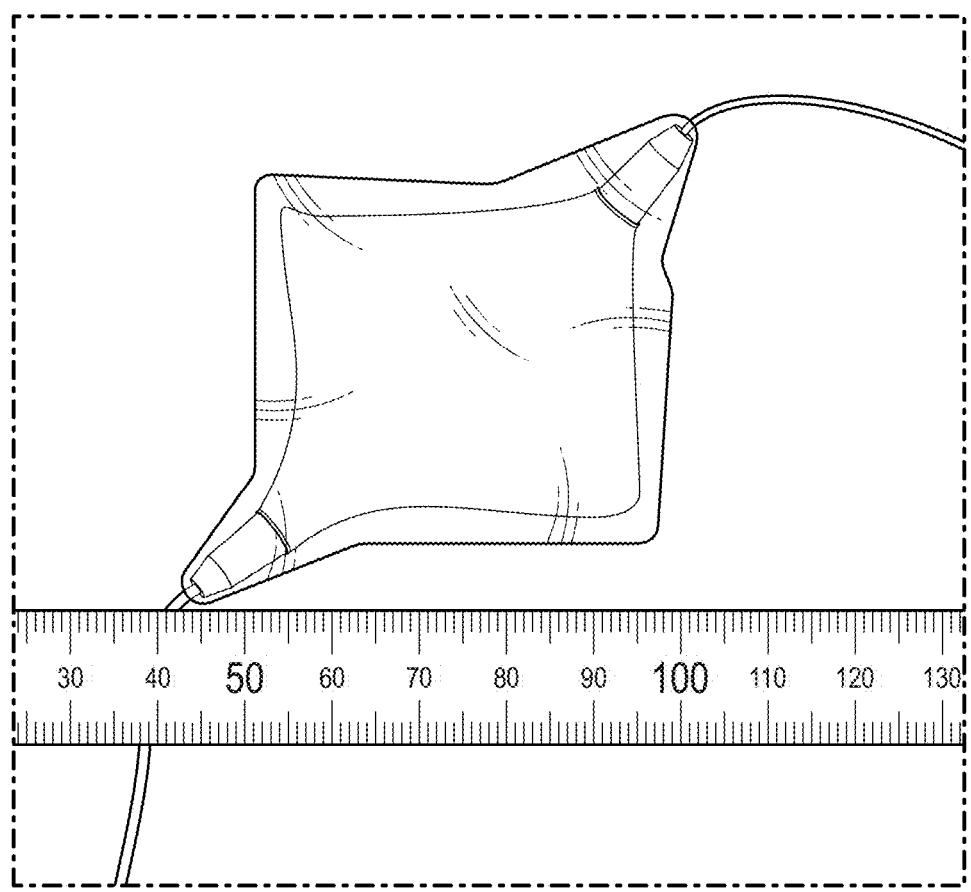
FIG. 20 is a photograph showing a piezoelectricity test piece.

As illustrated in FIG. 19, 30 mg of an oriented fiber sheet (A or B) was weighed, and embedded in epoxy in a size of 20 mm×20 mm×0.15 mm. Then, a test piece having a size of 40 mm×40 mm×0.2 mm in which the oriented fiber sheet (A or B) was disposed at the center was prepared using an epoxy resin again. At this time, processing was performed by sandwiching with a polyacetal resin, and the thickness was adjusted with a filler gauge. Thereafter, an electrode of 25 mm×25 mm and a conductive wire were attached to both surfaces, and insulated and embedded with an insulating tape (Kapton tape) (see FIG. 20).

Piezoelectricity Evaluation

A displacement of 0.5 mm (strain of 2.5%) was loaded on each test piece using EZgraph, and the potential was measured with an oscilloscope via a differential amplifier circuit. The differential amplifier circuit (10 times amplification) (operational amplifier (OP-AMP NJM2082)) has a mechanism capable of amplifying the measured waveform 10 times through a positive feedback type secondary low pass filter that passes a potential difference from one side to the other side of the test piece and 10 Hz or less and a notch filter that removes around 60 Hz.

Figure 21:
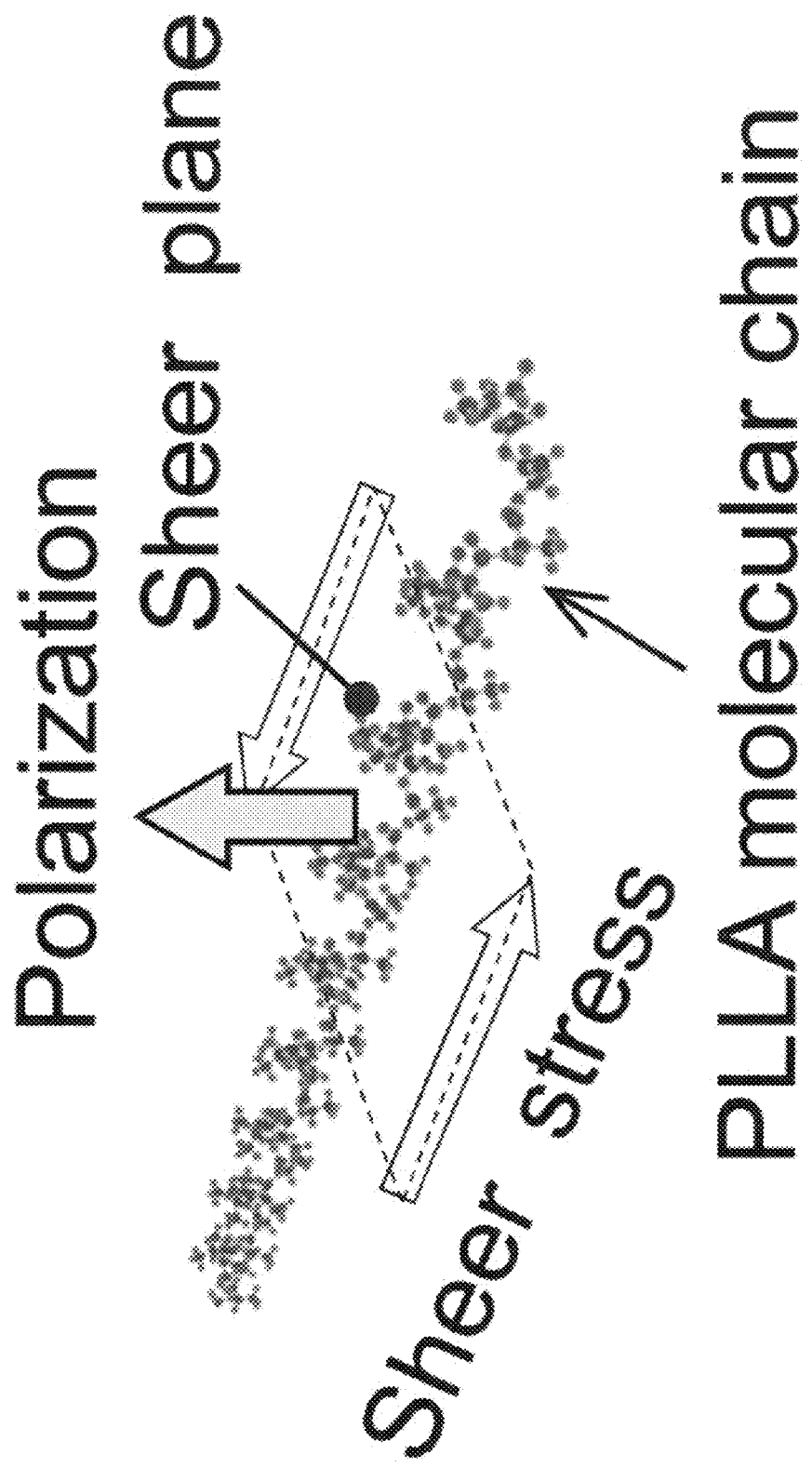
FIG. 21 is a schematic diagram schematically illustrating the generation of a potential in PLLA.
Figure 22:
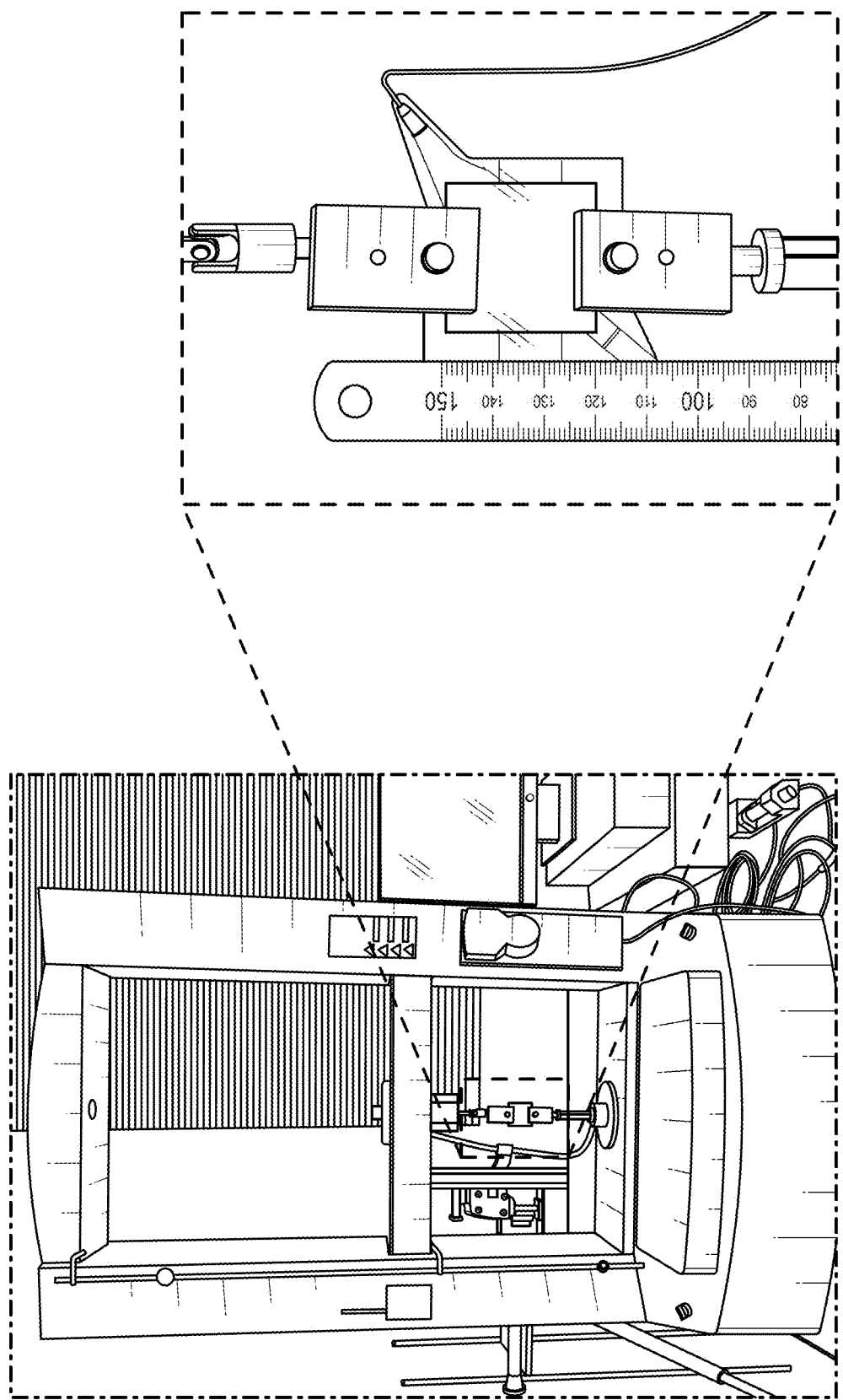
FIG. 22 is a photograph showing a piezoelectricity testing device.

It is known that the piezoelectricity of PLLA is polarized in a direction perpendicular to a shear plane when a shear stress is generated in a molecular chain axial direction (FIG. 21). For that, it is necessary to apply a shear stress in the fiber axis direction, and in this experiment, tension was applied in directions of 45° and 135° with respect to the fiber axis direction (see FIG. 22).

Tensile Test Conditions

Tensile is applied in 45° direction and 135° direction.
Displacement: 0.5 mm (strain: 2.5%), 2 Hz cycle
Tester: EZgraph
Measuring instrument: oscilloscope Piezoelectricity Test Piece Test piece A: oriented fiber sheet A (target temperature: 86° C., BTEAC addition rate: 3 w/w %)
Test piece B: oriented fiber sheet B (target temperature: 25° C. (without preheating), BTEAC addition rate 0: w/w %)

(Measurement of Potential versus Displacement)

Measurement Results of Test Piece A

Figure 23:
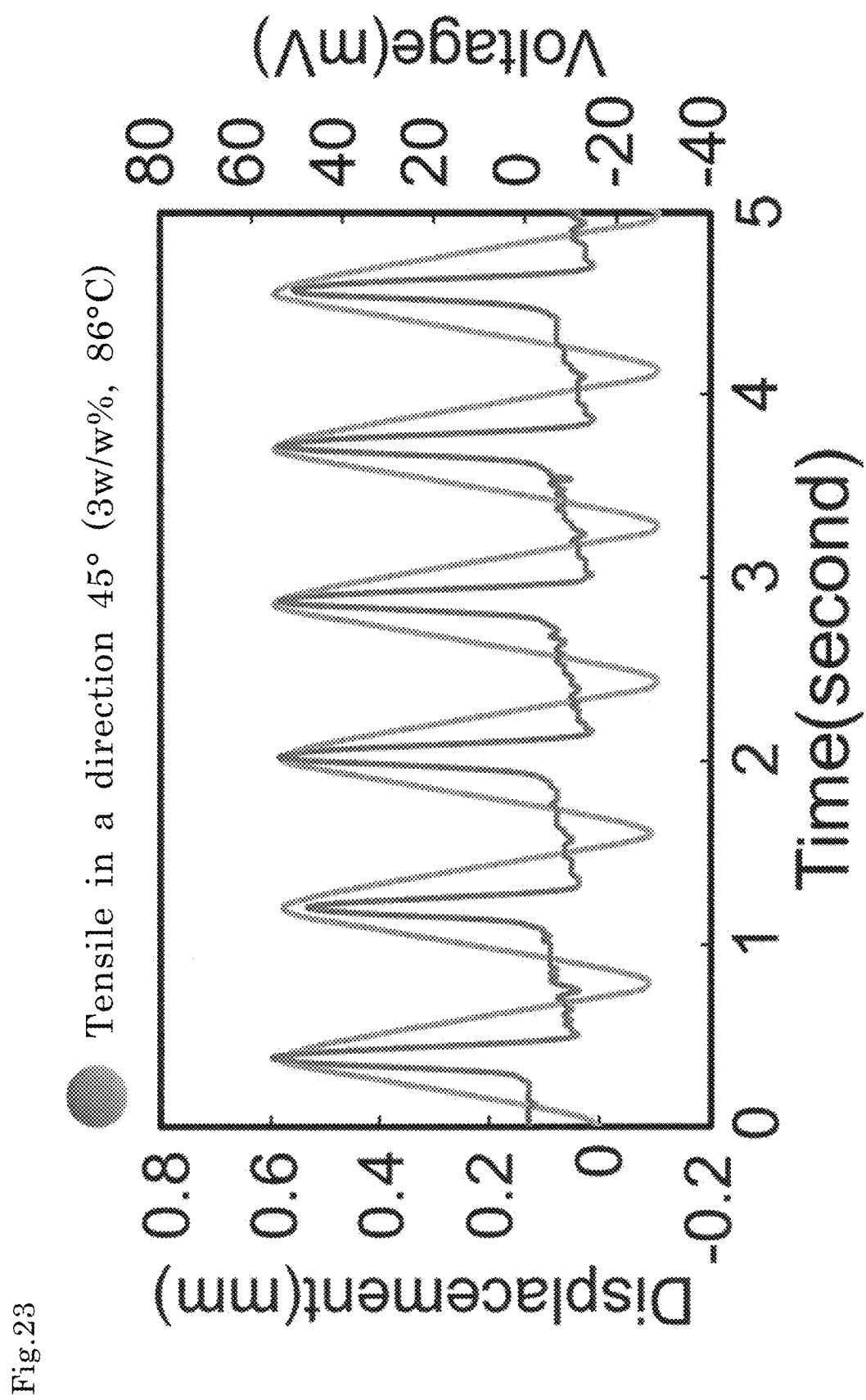
FIG. 23 is a graph showing the results of measurement of the potential versus the displacement when a tension was applied in a 45° direction with respect to the fiber axis direction of the oriented fiber sheet (BTEAC addition rate: 3 w/w %, target temperature: 86° C.)

FIG. 23 shows the results of measurement of a potential versus a displacement when a tension was applied in a direction 45° with respect to the fiber axis direction of the oriented fiber sheet (the thick line indicates a voltage).

Figure 24:
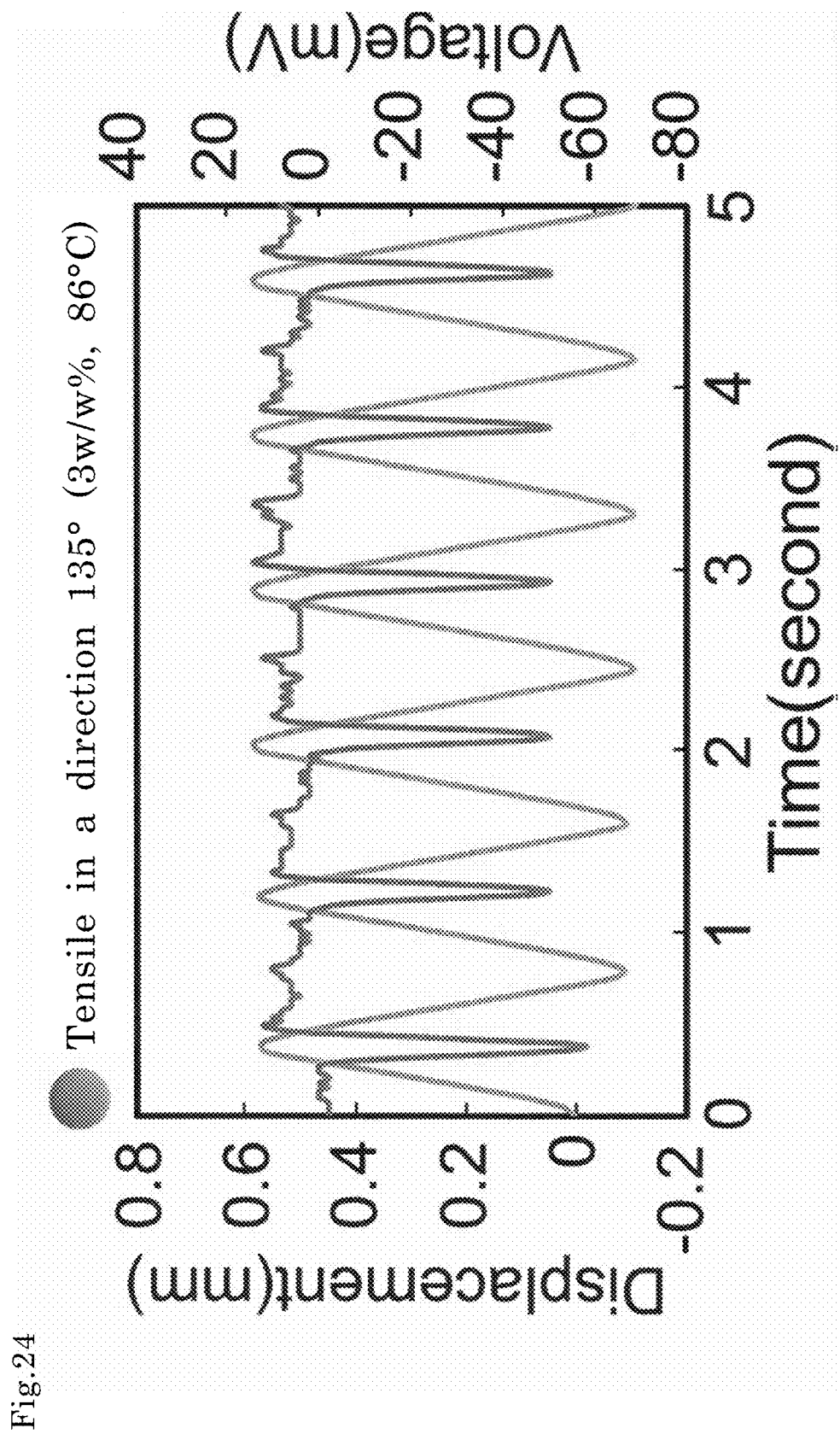
FIG. 24 is a graph showing the results of measurement of the potential versus the displacement when a tension was applied in a 135° direction with respect to the fiber axis direction of the oriented fiber sheet (BTEAC addition rate: 3 w/w %, target temperature: 86° C.)

FIG. 24 shows the results of measurement of a potential versus a displacement when a tension was applied in a direction 135° with respect to the fiber axis direction of the oriented fiber sheet (the thick line indicates a voltage).

With the test piece A, according to the comparison between the 45° direction (FIG. 23) and the 135° direction (FIG. 24), a response in which the sign (positive/negative) of a potential was reversed versus a displacement was obtained, and therefore it was confirmed that a potential was generated due to the piezoelectricity of the nanofiber sheet contained in the test piece.

Measurement Results of Test Piece B

Figure 25:
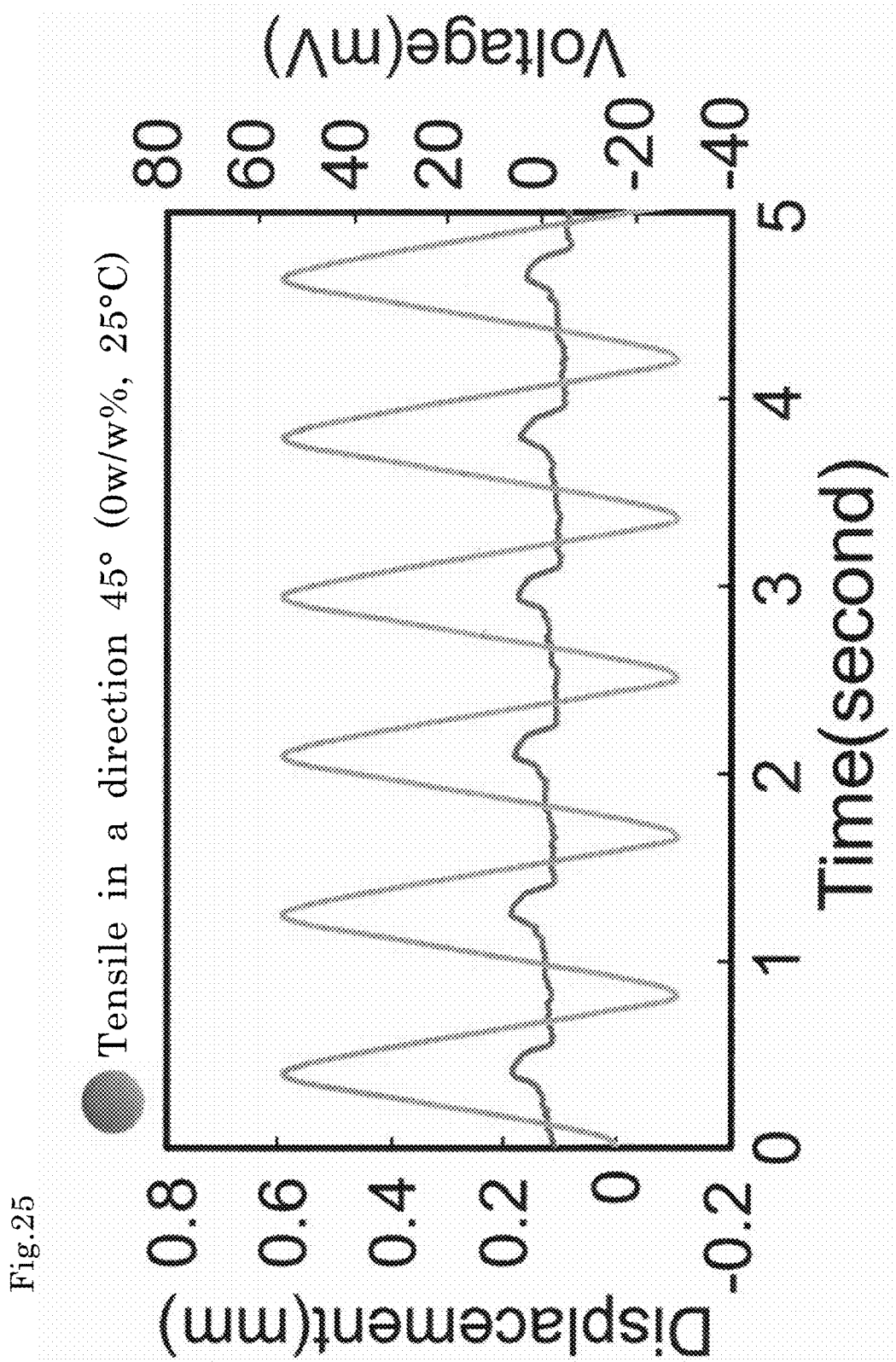
FIG. 25 is a graph showing the results of measurement of the potential versus the displacement when a tension was applied in a 45° direction with respect to the fiber axis direction of the oriented fiber sheet (BTEAC addition rate: 0 w/w %, target temperature: 25° C. (without preheating))

FIG. 25 shows the results of measurement of a potential versus a displacement when a tension is applied in a direction 45° with respect to the fiber axis direction of the oriented fiber sheet (the thick line indicates a voltage).

With the test piece B, it was found that the generated potential remarkably decreased. This is considered to be because preheating was not performed.

Results of Measurement of Blank (Epoxy Resin)

Figure 26:
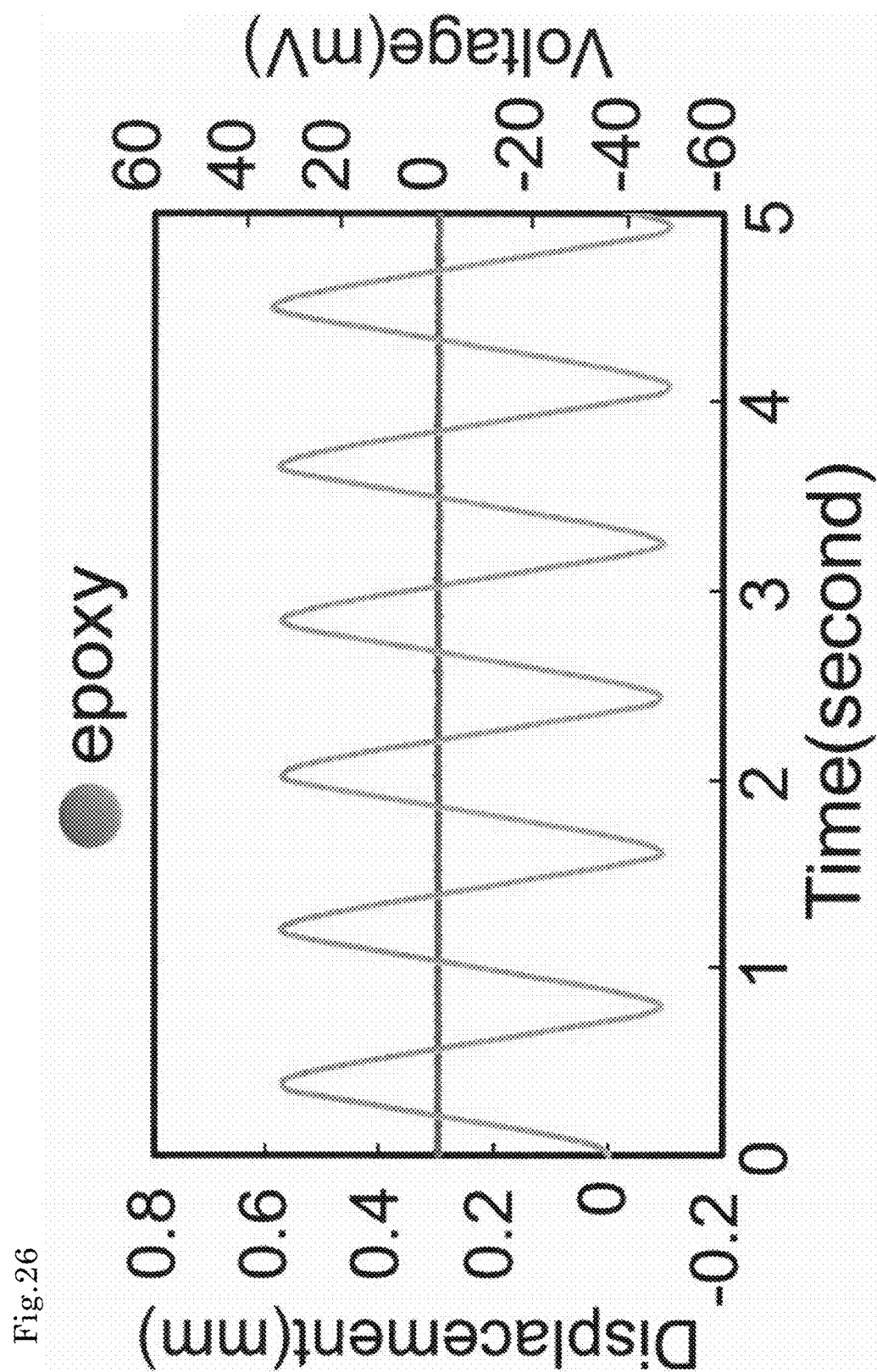
FIG. 26 is a graph showing the results of measurement of the potential versus the displacement when a tension was applied to an epoxy resin (blank)

As shown in FIG. 26, the results of measurement of a potential versus a displacement of the epoxy resin as a blank is shown (the thick line indicates a voltage).

The potential of the epoxy resin was measured, and it was confirmed that no potential was generated in accordance with the displacement.

From the results shown in FIGS. 23 to 26, it was found that when the target board was not preheated and also BTEAC was not added, the generated potential remarkably decreased (see FIG. 25).

The averages of the potentials measured in the tensile directions of 45° and 135° in the same manner as described above for the test piece A and the test piece B are shown below (n=18).

TABLE 5

| Tensile direction | Test piece A<br>BTEAC 3 w/w %<br>Target temperature 86° C. | Test piece B<br>BTEAC 0 w/w %<br>Target temperature 25° C.<br>(without preheating) |
|---|---|---|
| 45° | 62 ± 10 mV | 9 ± 1 mV |
| 135° | 59 ± 14 mV | 8 ± 3 mV |

With the test piece A, since the target board was preheated and BTEAC was added, an average potential as high as about 7 times that of the test piece B was obtained.

(Measurement of Potential versus Load)

Measurement Results of Test Piece A

Figure 27:
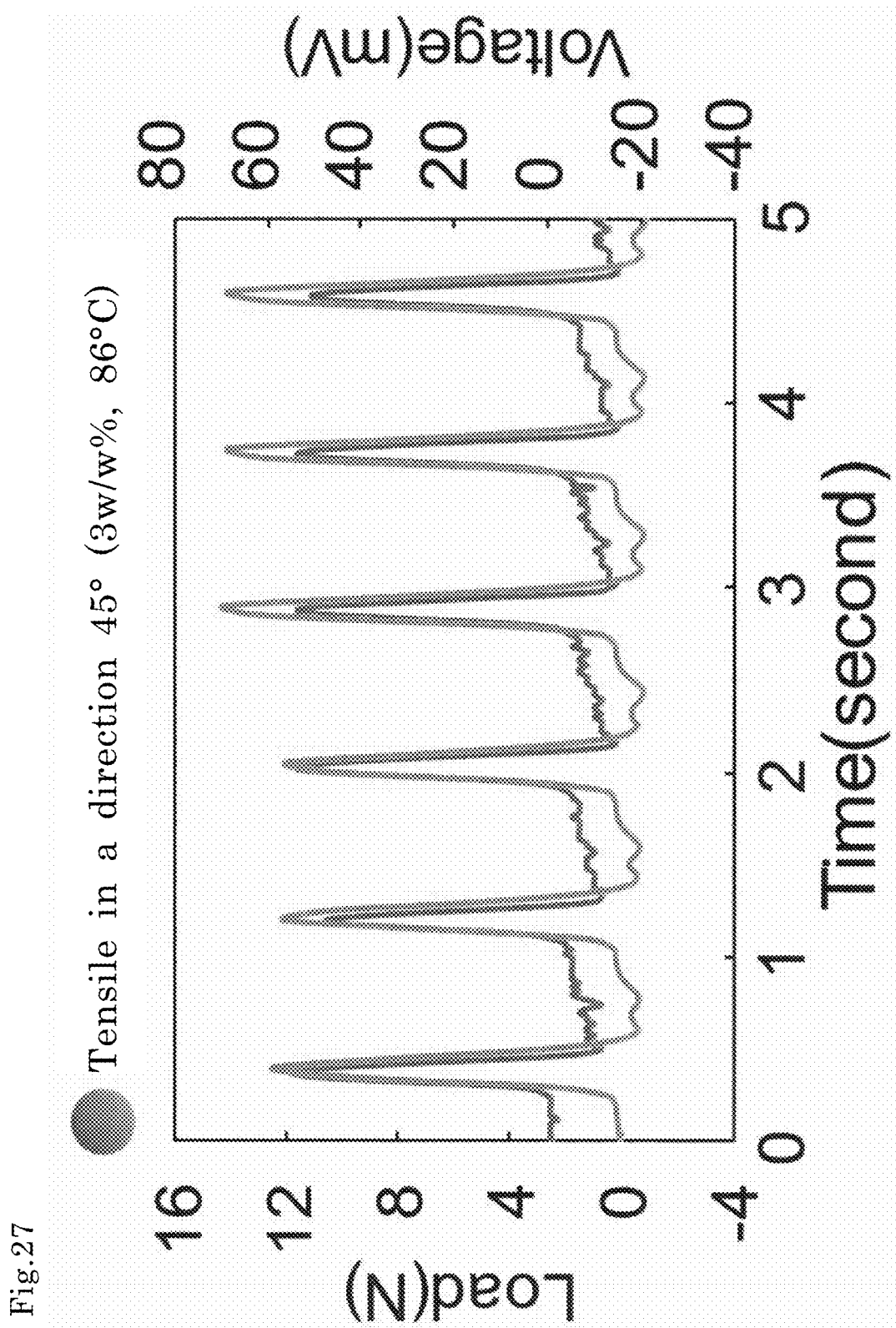
FIG. 27 is a graph showing results of measurement of the potential with respect to the load when tension was applied in a 45° direction with respect to the fiber axis direction of the oriented fiber sheet (BTEAC addition rate: 3 w/w %, target temperature: 86° C.)

FIG. 27 shows the results of measurement of a potential versus a load when a tension is applied in a direction 45° with respect to the fiber axis direction (the thick line indicates a voltage).

Figure 28:
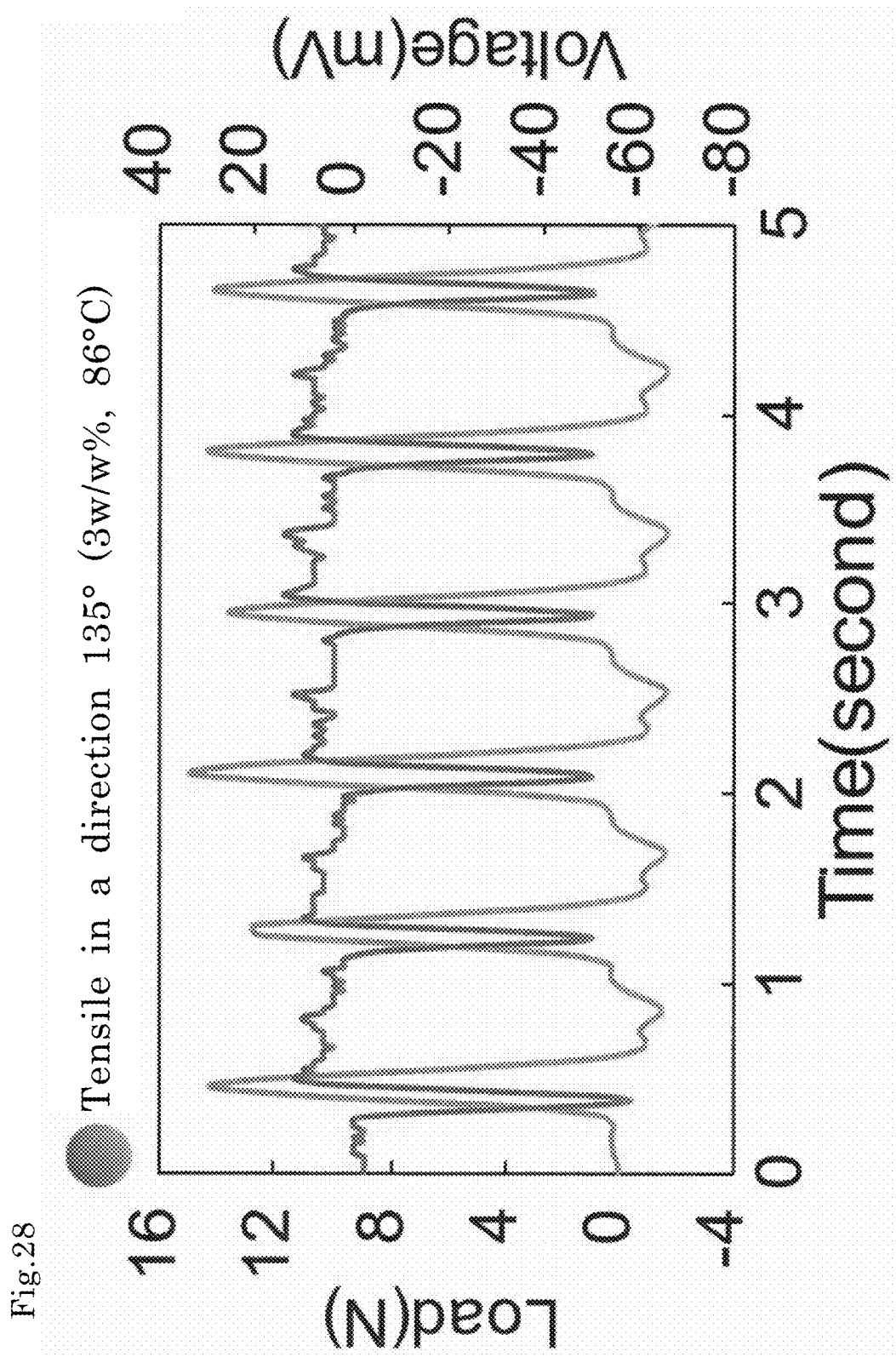
FIG. 28 is a graph showing results of measurement of the potential with respect to the load when tension was applied in a 135° direction with respect to the fiber axis direction of the oriented fiber sheet (BTEAC addition rate: 3 w/w %, target temperature: 86° C.)

FIG. 28 shows the results of measurement of a potential versus a load when a tension is applied in a direction 135° with respect to the fiber axis direction (the thick line indicates a voltage).

With the test piece A, according to the comparison between the 45° direction (FIG. 27) and the 135° direction (FIG. 28), the sign (positive/negative) of a potential was reversed versus the load, and therefore it was confirmed that a potential was generated due to the piezoelectric nanofiber sheet contained in the test piece.

Measurement Results of Test Piece B

Figure 29:
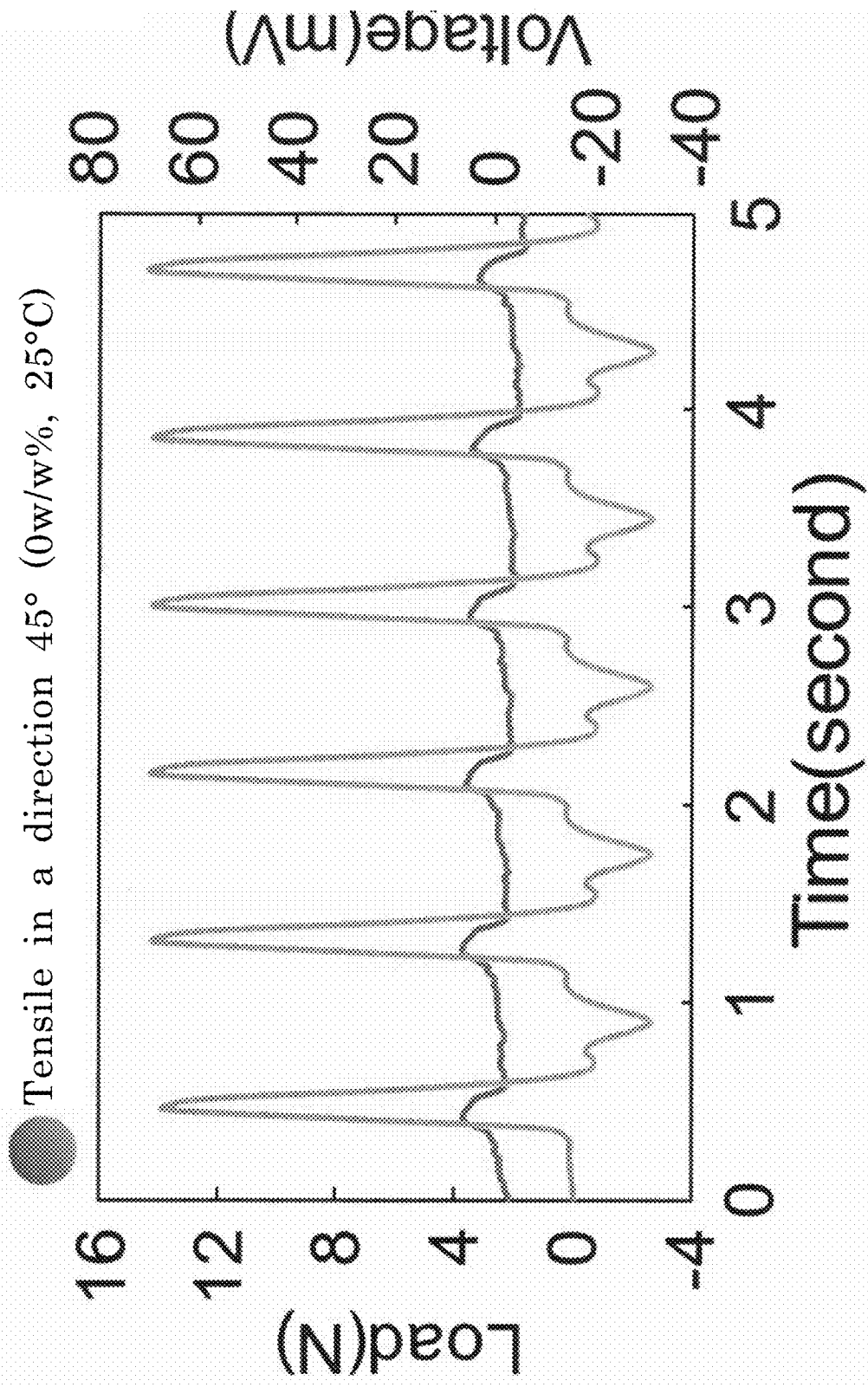
FIG. 29 is a graph showing results of measurement of the potential with respect to the load when tension was applied in a 45° direction with respect to the fiber axis direction of the oriented fiber sheet (BTEAC addition rate: 0 w/w %, target temperature: 25° C. (without preheating))

FIG. 29 shows the results of measurement of a potential versus a load when a tension is applied in a direction 45° with respect to the fiber axis direction (the thick line indicates a voltage).

With the test piece B, it was found that the generated potential remarkably decreased. This is considered to be because preheating was not performed.

Results of Measurement of Blank (Epoxy Resin)

Figure 30:
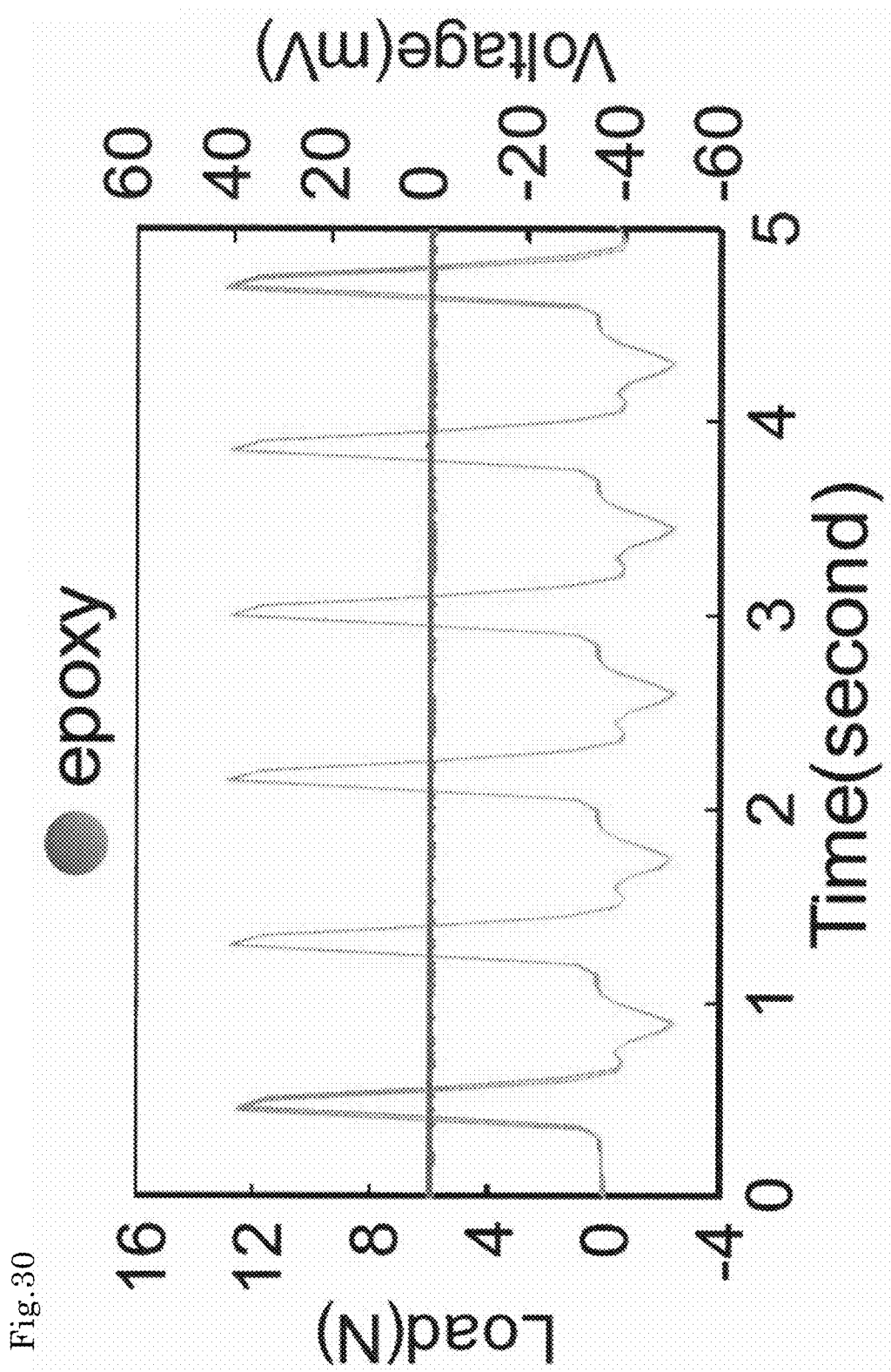
FIG. 30 is a graph showing measurement results of the potential to the load when a tension is applied to an epoxy resin (blank)

As shown in FIG. 30, the results of measurement of a potential versus a load to the epoxy resin as a blank is shown (the thick line indicates a voltage).

The potential of the epoxy resin was measured, and it was confirmed that no potential was generated in accordance with the load.

From the results shown in FIGS. 27 to 30, it was found that when the BTEAC addition rate was 0 w/w % and the target board was not preheated, the generated potential remarkably decreased (see FIG. 29).

(Vertical Electrospinning Device)

In the experimental examples described above, a horizontal electrospinning device (see FIGS. 1 and 5) was used, but in the present experimental example, a fiber sheet having a target fiber diameter of 500 nm was produced under the following conditions using a vertical electrospinning device (NANON-04, manufactured by MECC CO., LTD.).
(Spinning Conditions)
Solution Conditions
  PLLA concentration: 12, 14, 16 w/v %
  Solvent: DOL/HFIP (70/30)
  BTEAC addition rate: 3 w/w %
Electrospinning Spinning Conditions
  Discharge rate (flow rate): 30, 40, 50 μl/min
  Spinning distance: 50, 75, 100 mm
  Applied voltage: 14 to 22 kV
  Spinning temperature: about 25° C.
  Humidity: 7 to 16%

Figure 31:
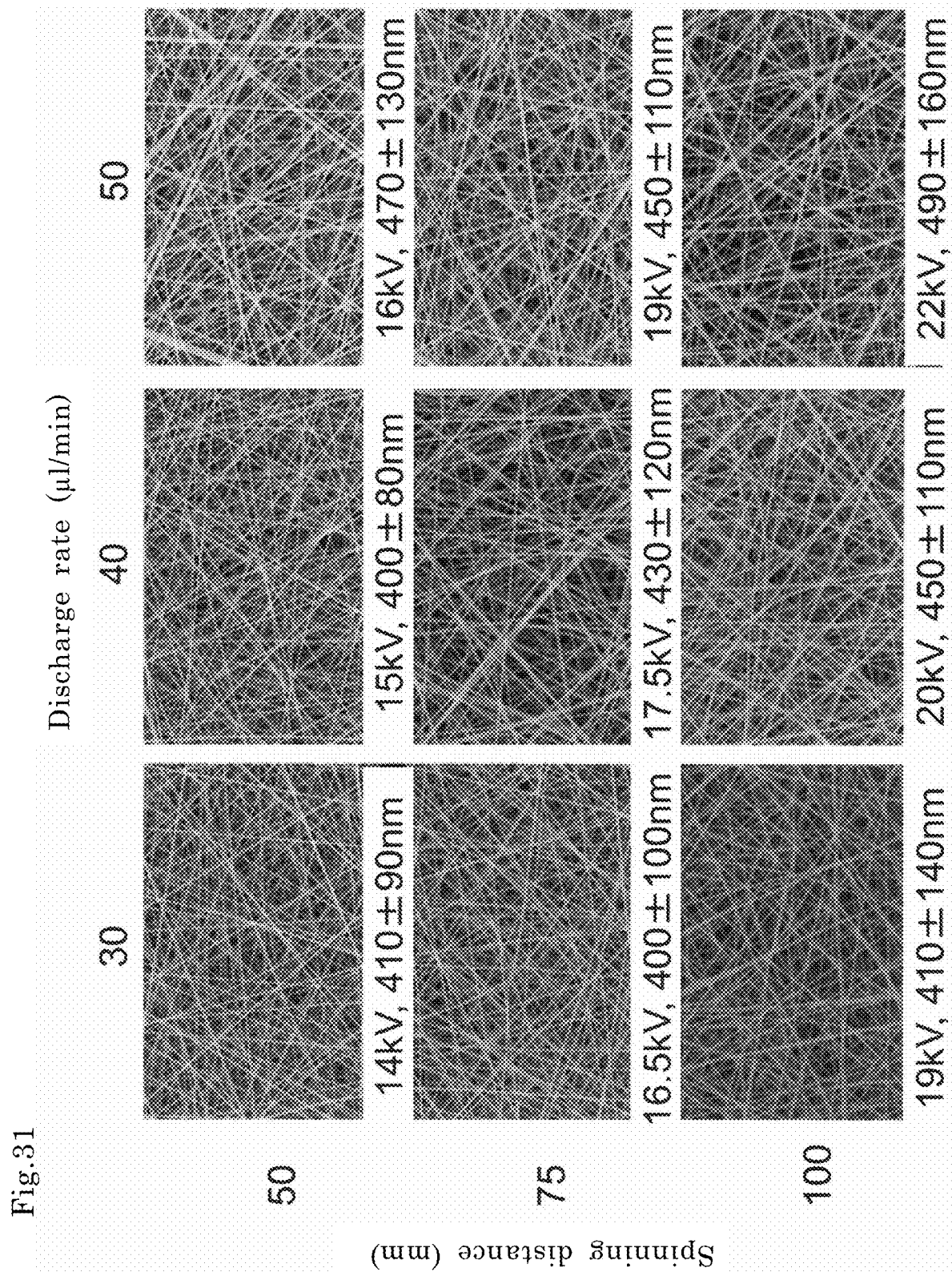
FIG. 31 shows an SEM image of a fiber sheet prepared with a vertical electrospinning device (PLLA concentration: 12 w/v %, 2000 magnifications)
Figure 32:
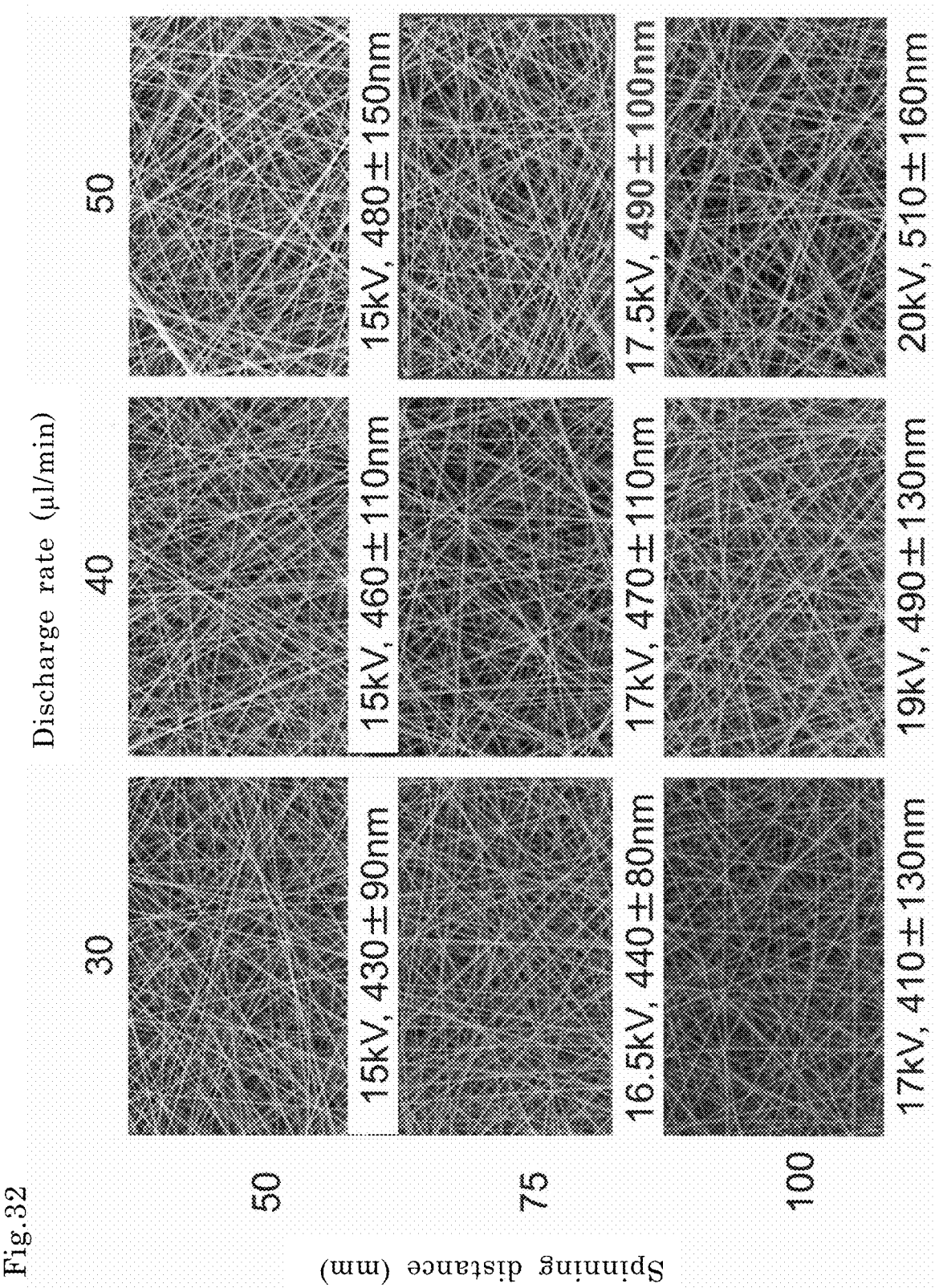
FIG. 32 shows an SEM image of a fiber sheet prepared with a vertical electrospinning device (PLLA concentration: 14 w/v %, 2000 magnifications)
Figure 33:
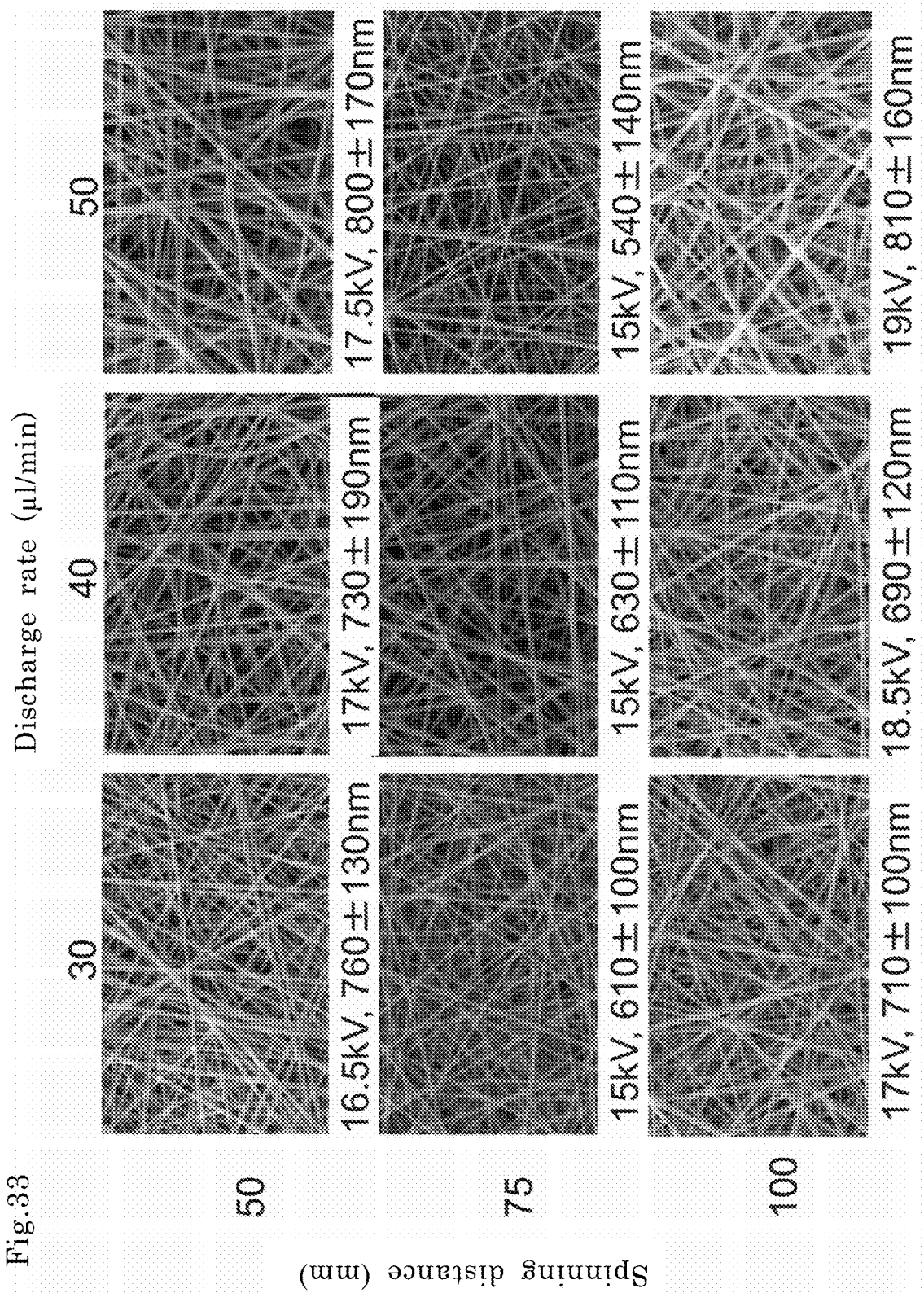
FIG. 33 shows an SEM image of a fiber sheet prepared with a vertical electrospinning device (PLLA concentration: 16 w/v %, 2000 magnifications)

SEM images of the fiber sheets prepared using the vertical electrospinning device are shown in FIG. 31 (PLLA concentration: 12 w/v %, 2000 magnifications), FIG. 32 (PLLA concentration: 14 w/v %, 2000 magnifications), and FIG. 33 (PLLA concentration: 16 w/v %, 2000 magnifications).

From the SEM images shown in FIGS. 31 to 33, a sheet having a good fiber form with less variation and no split or the like having a fiber diameter of about 500 nm was successfully obtained at a PLLA concentration of 14 w/v %, a discharge rate of 50 μl/min, and a spinning distance of 75 mm (see FIG. 32). In the above experiment, the target board was heated so that the target temperature did not become 25° C. or lower.

(Study on Best Spinning Conditions)

Since it was found from the above results (PLLA concentration: 14 w/v %, discharge rate: 50 μl/min, spinning distance: 75 mm) that a sheet having a good fiber form was obtained, the concentration of BTEAC was adjusted to 1 to 3 w/w %, and the target temperature was adjusted within a range of 40° C. to 80° C., and fiber sheets were produced in the same manner as described above.
Solution Conditions
  PLLA concentration: 14 w/v %
  Solvent: DOL/HFIP (70/30)
  Addition rate of BTEAC: 1, 2, 3 w/w %
Electrospinning Spinning Conditions
  Discharge rate (flow rate): 50 μl/min
  Spinning Distance: 75 mm
  Applied voltage: 17.5 to 19 kV
  Target temperature: 40° C., 60° C., 80° C.

As in Example 1, the fiber diameter (nm), the coefficient of variation (%), the degree of crystallinity (%), and the crystallization temperature (° C.) are shown in the following table.

TALE 6

| Fiber Diameter (unit: nm, average ± standard deviation) | | | |
| --- | --- | --- | --- |
| BTEAC addition rate | Target temperature (° C.) | | |
| (w/w %) | 40 | 60 | 80 |
| 1 | 510 ± 60 | 530 ± 70 | 520 ± 90 |
| 2 | 460 ± 60 | 490 ± 80 | 520 ± 80 |
| 3 | 470 ± 60 | 540 ± 80 | 550 ± 90 |

TABLE 7

| Coefficient of Variation (%) | | | |
| --- | --- | --- | --- |
| BTEAC addition rate | Target temperature (° C.) | | |
| (w/w %) | 40 | 60 | 80 |
| 1 | 12 | 13 | 17 |
| 2 | 13 | 16 | 15 |
| 3 | 13 | 15 | 16 |

TABLE 8

| Degree of Crystallinity (%) | | | |
| --- | --- | --- | --- |
| BTEAC addition rate | Target temperature (° C.) | | |
| (w/w %) | 40 | 60 | 80 |
| 1 | 47 | 46 | 48 |
| 2 | 51 | 53 | 54 |
| 3 | 41 | 51 | 53 |

TABLE 9

| Crystallization Temperature (° C.) | | | |
| --- | --- | --- | --- |
| BTEAC addition rate | Target temperature (° C.) | | |
| (w/w %) | 40 | 60 | 80 |
| 1 | 72.7 | 75.3 | 77.2 |
| 2 | 71.4 | 73.0 | 74.6 |
| 3 | 72.8 | 74.0 | 75.7 |

From the above results, it was found that better results are obtained when the BTEAC addition rate is 3 w/w % or less, particularly 2 w/w %, and the target temperature is within a range of 60° C. to 80° C.

Figure 34:
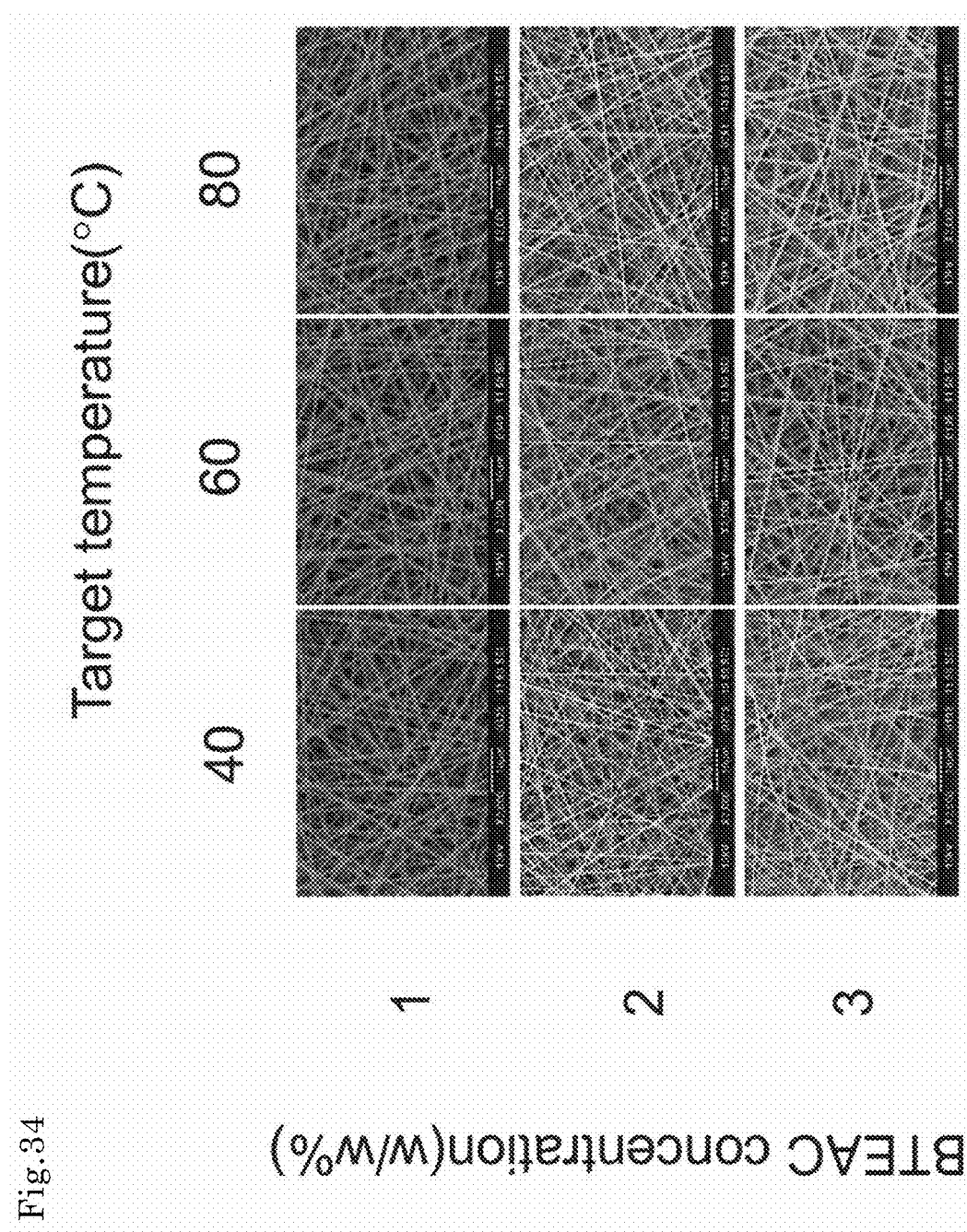
FIG. 34 shows an SEM image of a fiber sheet prepared with a vertical electrospinning device (BTEAC concentration: 1 to 3 w/w %, target temperature: 40 to 80° C., 2000 magnifications).

In addition, electron micrographs (SEM image) of the fiber sheets produced in the above experiments are shown in FIG. 34.

All of the above experimental examples are shown as examples for describing the present invention in more detail, and the present invention should not be construed as being limited to the above experimental examples.

The present invention can provide a sheet-like material suitable for the activation or proliferation or culture of cells. Materials obtained according to the present invention can be used as, for example, a scaffolding material, a scaffold, a container, or the like for proliferating or culturing cells. In addition, materials obtained by the present invention can be widely used in the fields of regenerative medicine related to regeneration of a living tissue, wound healing, surgical operation, and the like. More specifically, by covering a wound as a substitute for a bandage or gauze, or as an adhesive plaster or the like, it is possible to activate cells more positively or actively and heal the wound.

It should be noted that the present invention described above includes the following aspects:

The first aspect: A method for producing a sheet comprising nanofibers comprising a high molecular weight piezoelectric material, the method for producing a sheet comprising nanofibers comprising at least the following steps (a) to (c):
  (a) a step of dissolving a high molecular weight piezoelectric material in a solvent to prepare a spinning dope comprising the high molecular weight piezoelectric material;
  (b) a step of, before forming nanofibers by spinning the spinning dope by electrospinning, heating in advance a target board for receiving the nanofibers;
  (c) a step of receiving nanofibers formed by electrospinning on the target board and molding the nanofibers into a sheet-like form on the target board.

The second aspect: The production method according to the first aspect, wherein a temperature at which the target board is heated in the step (b) is equal to or higher than a temperature of the spinning dope.

The third aspect: The production method according to the second aspect, wherein a temperature at which the target board is heated is equal to or higher than a glass transition temperature of the high molecular weight piezoelectric material contained in the spinning dope.

The fourth aspect: The production method according to the second or third aspect, wherein a temperature at which the target board is heated is higher than 25° C. and lower than 100° C.

The fifth aspect: The production method according to any one of the first to fourth aspects, wherein the solvent contained in the spinning dope prepared in the step (a) is 1,3-dioxolane.

The sixth aspect: The production method according to any one of the first to fifth aspects, wherein the spinning dope further comprises a surfactant, and the surfactant is 1,1,1,3,3,3-hexafluoro-2-propanol (HFIP).

The seventh aspect: The production method according to any one of the first to sixth aspects, wherein the spinning dope further comprises a conductivity imparting agent, and the conductivity imparting agent is benzyltriethylammonium chloride (BTEAC).

The eighth aspect: The production method according to the seventh aspect, wherein the BTEAC is contained in the spinning dope in an amount of 5 w/w % or less based on a total weight of the high molecular weight piezoelectric material.

The ninth aspect: The production method according to the seventh aspect, wherein the BTEAC is contained in the spinning dope in an amount of 4 w/w % or less based on a total weight of the high molecular weight piezoelectric material.

The tenth aspect: The production method according to the seventh aspect, wherein the BTEAC is contained in the spinning dope in an amount of 3 w/w % or less based on a total weight of the high molecular weight piezoelectric material.

The eleventh aspect: The production method according to any one of the first to tenth aspects, wherein heating the target board improves the degree of crystallinity of the high molecular weight piezoelectric material by 5% or more in the nanofibers as compared with a case where the target board is not heated.

The twelfth aspect: The production method according to any one of the first to eleventh aspects, wherein in the step (c), the spinning dope is positively charged by application of a positive voltage to the spinning dope, and then while the spinning dope is spun by electrospinning to form positively charged nanofibers, the target board is grounded, the nanofibers are collected on the target board, and the sheet is formed.

The thirteenth aspect: The production method according to any one of the first to twelfth aspects, wherein the spinning dope is ejected in a horizontal direction or a direction perpendicular to the horizontal direction.

The fourteenth aspect: The production method according to any one of the first to thirteenth aspects, wherein a concentration of the high molecular weight piezoelectric material contained in the spinning dope is 20 w/v % or less.

The fifteenth aspect: The production method according to any one of the first to fourteenth aspects, wherein a discharge rate of the spinning dope is 20 μl/min or more and 60 μl/min or less.

The sixteenth aspect: The production method according to any one of the first to fifteenth aspects, wherein a distance to the target board is 100 mm or less.

The seventeenth aspect: The production method according to any one of the first to sixteenth aspects, wherein the sheet is a mass of the nanofibers.

The eighteenth aspect: The production method according to any one of the first to seventeenth aspects, wherein the high molecular weight piezoelectric material is a polylactic acid-based macromolecule.

The nineteenth aspect: A sheet produced by the method according to any one of the first to eighteenth aspects.

The twentieth aspect: A sheet comprising nanofibers comprising a high molecular weight piezoelectric material, wherein the high molecular weight piezoelectric material contained in the nanofibers has a degree of crystallinity of 20% or more.

The twenty first aspect: A sheet comprising nanofibers comprising a high molecular weight piezoelectric material, wherein the fiber diameter of the nanofibers contained in the sheet is uniform.

The twenty second aspect: The sheet according to the twenty first aspect, wherein the nanofibers have a fiber diameter of 800 nm or less.

The twenty third aspect: The sheet according to the twenty first aspect, wherein the nanofibers have a fiber diameter of 400 nm or more and 600 nm or less.

The twenty fourth aspect: The sheet according to any one of the twenty first to twenty third aspects, wherein a standard deviation (SD) of the fiber diameter of the nanofibers contained in the sheet is 10 or more and 150 or less.

The twenty fifth aspect: The sheet according to any one of the twenty first to twenty fourth aspects, wherein a coefficient of variation (CV) of the fiber diameter of the nanofibers contained in the sheet is 5% or more and 20% or less.

The twenty sixth aspect: A sheet comprising nanofibers comprising a high molecular weight piezoelectric material, wherein the sheet comprises at least one element selected from the group consisting of nitrogen and chlorine.

The twenty seventh aspect: The sheet according to the twenty sixth aspect, wherein the element is derived from benzyltriethylammonium chloride (BTEAC).

The twenty eighth aspect: A sheet comprising nanofibers comprising a high molecular weight piezoelectric material, wherein the sheet has a peak with an intensity of 30,000 or more within a range of an angle ($2\theta$) of 15° or more and 20° or less by an X-ray diffraction (XRD).

The twenty ninth aspect: The sheet according to any one of the twentieth to twenty eighth aspects, wherein the high molecular weight piezoelectric material is a polylactic acid-based macromolecule.

The thirtieth aspect: The sheet according to any one of the twentieth to twenty ninth aspects, wherein the sheet is a mass of the nanofibers.

The thirty first aspect: The sheet according to any one of the twentieth to thirtieth aspects, wherein the sheet has orientation.

The thirty second aspect: The sheet according to any one of the twentieth to thirty first aspects, wherein the sheet generates a potential when the sheet is displaced or loaded.

The thirty third aspect: The sheet according to any one of the twentieth to thirty second aspects, wherein the sheet is used for activation or proliferation or culture of cells.

What is claimed is:
1. A sheet comprising nanofibers, the nanofibers comprising a high molecular weight piezoelectric material with a degree of crystallinity of 50% or more, wherein a fiber diameter of the nanofibers contained in the sheet is 400 nm to 600 nm, and wherein the sheet has orientation in which an orientation angle of a minor axis direction is ±45° or less in an elliptical approximation.

2. The sheet according to claim 1, wherein the fiber diameter is uniform.

3. The sheet according to claim 1, wherein a standard deviation (SD) of the fiber diameter of the nanofibers contained in the sheet is 10 to 150.

4. The sheet according to claim 1, wherein a coefficient of variation (CV) of the fiber diameter of the nanofibers contained in the sheet is 5% to 20%.

5. The sheet according to claim 1, wherein the sheet comprises at least one element selected from the group consisting of nitrogen and chlorine.

6. The sheet according to claim 1, wherein the sheet has a peak with an intensity of 30,000 or more within a range of an angle (2θ) of 15° to 20° by an X-ray diffraction (XRD).

7. The sheet according to claim 1, wherein the high molecular weight piezoelectric material is a polylactic acid-based macromolecule.

8. The sheet according to claim 1, wherein the sheet is constructed to generate a potential when the sheet is displaced or loaded.

\* \* \* \* \*